(12) United States Patent
Lee

(10) Patent No.: US 11,683,940 B2
(45) Date of Patent: Jun. 20, 2023

(54) METHOD OF MANUFACTURING VARIABLE RESISTANCE MEMORY DEVICE

(71) Applicant: SAMSUNG ELECTRONICS CO., LTD., Suwon-si (KR)

(72) Inventor: Dongkyu Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 49 days.

(21) Appl. No.: 17/339,297

(22) Filed: Jun. 4, 2021

(65) Prior Publication Data
US 2021/0296399 A1 Sep. 23, 2021

Related U.S. Application Data

(62) Division of application No. 16/587,250, filed on Sep. 30, 2019, now abandoned.

(30) Foreign Application Priority Data

Mar. 29, 2019 (KR) .................. 10-2019-0037384

(51) Int. Cl.
*H01L 27/24* (2006.01)
*H01L 45/00* (2006.01)

(52) U.S. Cl.
CPC .......... *H01L 27/2454* (2013.01); *H01L 45/08* (2013.01); *H01L 45/1233* (2013.01); *H01L 45/1608* (2013.01)

(58) Field of Classification Search
CPC ............. H01L 27/2454; H01L 27/2427; H01L 27/2463; H01L 27/2409; H01L 45/122; H01L 45/1253; H01L 45/08; H01L 45/1233; H01L 45/1608; H01L 45/146; H01L 45/1675; H01L 27/11206; H01L 27/11273; H01L 27/11253; H01L 27/11266; H01L 27/11293; H01L 27/1128; H01L 27/2481; H01L 27/249; H01L 45/06; H01L 45/065; H01L 45/085; H01L 45/1206; H01L 45/126; H01L 45/1273; H01L 45/1263; H01L 45/1246; H01L 29/732; H01L 29/7371; H01L 29/7395; H01L 29/7397; H01L 29/78642;
(Continued)

(56) References Cited

U.S. PATENT DOCUMENTS 8,835,895 B2 9/2014 Sumino et al.
9,401,385 B2 7/2016 Seo et al.
(Continued)

FOREIGN PATENT DOCUMENTS

KR 10-1776858 B1 9/2017

*Primary Examiner* — Natalia A Gondarenko
(74) *Attorney, Agent, or Firm* — Lee IP Law, P.C.

(57) ABSTRACT

A variable resistance memory device and a method of manufacturing the same, the variable resistance memory device including a substrate including a first memory region and a second memory region; a plurality of first memory cells on the first memory region; and a plurality of second memory cells on the second memory region, wherein each of the first memory cells includes a first resistance element and a selection element, each of the second memory cells includes a second resistance element, and a maximum value of a variable resistance of the second resistance element is less than a maximum value of a variable resistance of the first resistance element.

10 Claims, 25 Drawing Sheets

(58) Field of Classification Search
CPC ............. H01L 29/7889; H01L 29/7926; H01L 2924/145–1453; H01L 2924/1438; H01L 45/04–065; H01L 45/14–144; H01L 45/16–1691; H01L 45/145–147
USPC ........................ 257/2, 5, 43, 47.001; 438/382
See application file for complete search history.

(56) References Cited

U.S. PATENT DOCUMENTS

| | | |
|---|---|---|
| 9,406,721 B1 | 8/2016 | Yamamoto et al. |
| 9,559,145 B2 | 1/2017 | Sim |
| 9,741,433 B2 | 8/2017 | Castro |
| 9,830,083 B2 | 11/2017 | Park et al. |
| 10,103,325 B2 * | 10/2018 | Chen .................... G11C 11/005 |
| 2009/0296461 A1 | 12/2009 | Kang et al. |
| 2010/0046285 A1 * | 2/2010 | Lung .................. H01L 45/1233 438/102 |
| 2011/0233510 A1 | 9/2011 | Kanzawa et al. |
| 2014/0034892 A1 | 2/2016 | Erbetta et al. |
| 2018/0211910 A1 | 7/2018 | Lee et al. |
| 2018/0323238 A1 | 11/2018 | Pellizzer et al. |
| 2018/0342669 A1 | 11/2018 | Kim et al. |

* cited by examiner

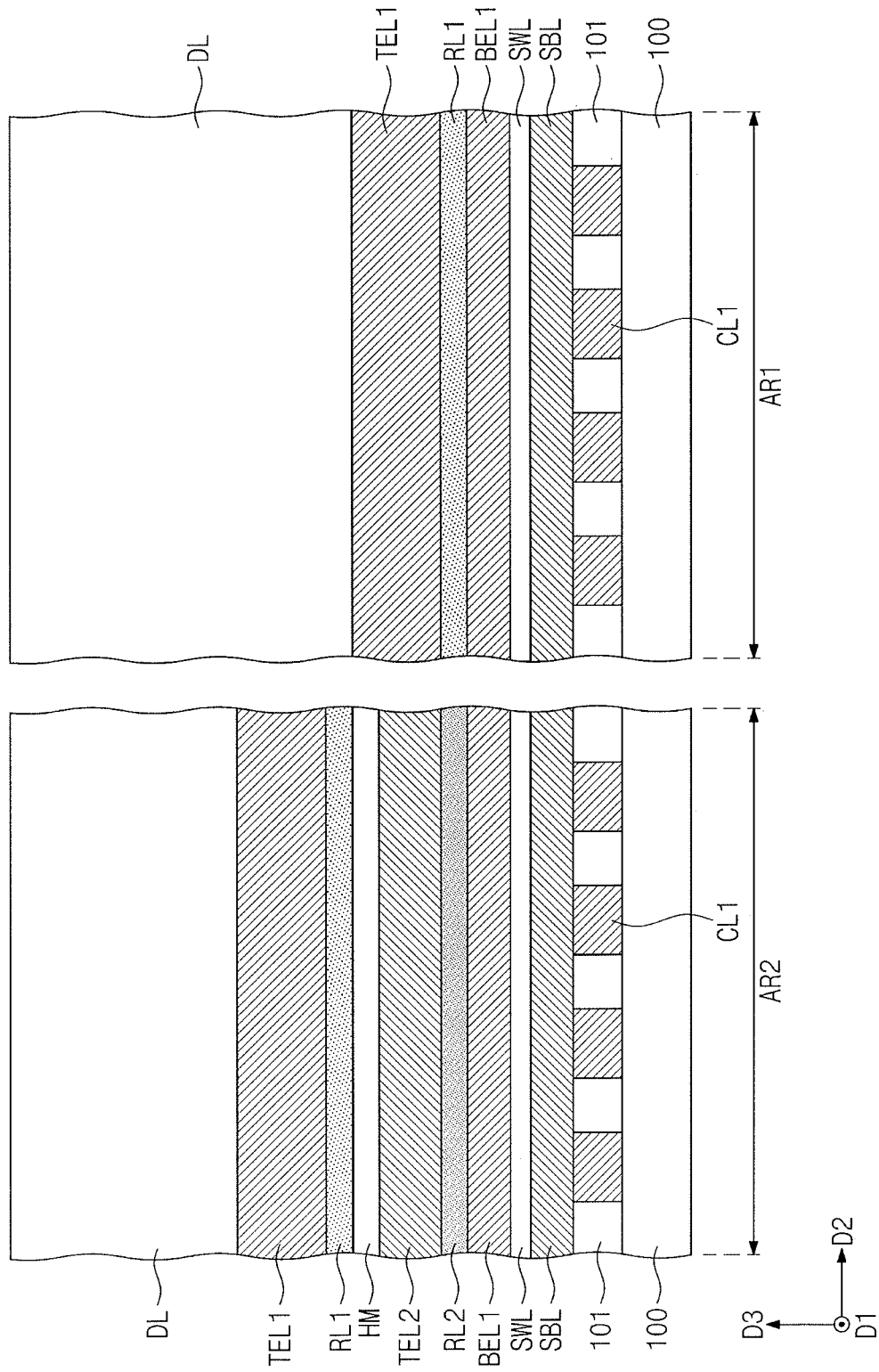

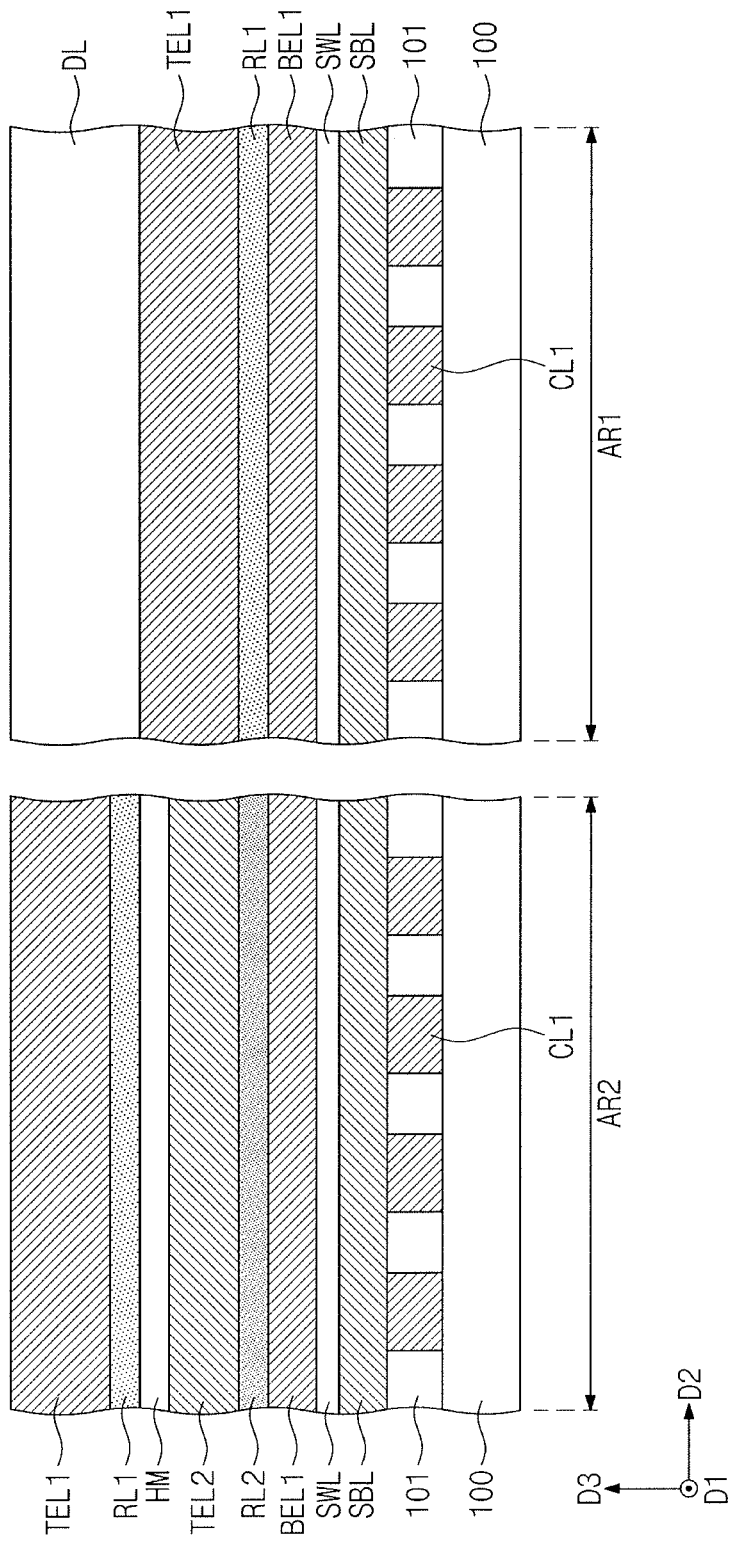

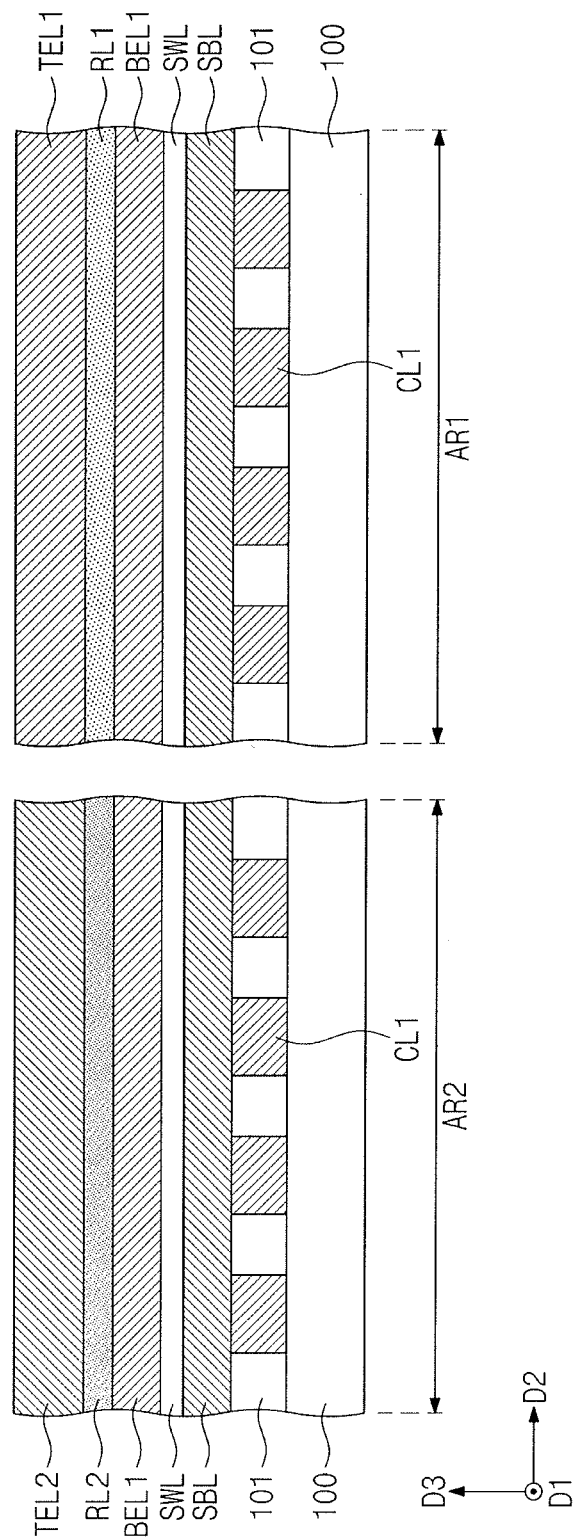

METHOD OF MANUFACTURING VARIABLE RESISTANCE MEMORY DEVICE

CROSS-REFERENCE TO RELATED APPLICATIONS

This is a divisional application based on pending application Ser. No. 16/587,250, filed Sep. 30, 2019, the entire contents of which is hereby incorporated by reference.

Korean Patent Application No. 10-2019-0037384, filed on Mar. 29, 2019, in the Korean Intellectual Property Office, and entitled: "Variable Resistance Memory Device and Method of Manufacturing the Same," is incorporated by reference herein in its entirety.

BACKGROUND

1. Field

Embodiments relate to a variable resistance memory device and a method of manufacturing the same.

2. Description of the Related Art

Semiconductor devices may be categorized as any one of memory devices and logic devices. The memory devices may store logical data. Semiconductor memory devices may be classified into volatile memory devices and non-volatile memory devices. The volatile memory devices may lose their stored data when their power supplies are interrupted. For example, the volatile memory devices may include dynamic random access memory (DRAM) devices and static random access memory (SRAM) devices. On the contrary, the non-volatile memory devices may retain their stored data even when their power supplies are interrupted. For example, the non-volatile memory devices may include programmable ROM (PROM), erasable PROM (EPROM), electrically EPROM (EEPROM), and a flash memory device.

SUMMARY

The embodiments may be realized by providing a variable resistance memory device including a substrate including a first memory region and a second memory region; a plurality of first memory cells on the first memory region; and a plurality of second memory cells on the second memory region, wherein each of the first memory cells includes a first resistance element and a selection element, each of the second memory cells includes a second resistance element, and a maximum value of a variable resistance of the second resistance element is less than a maximum value of a variable resistance of the first resistance element.

The embodiments may be realized by providing a method of manufacturing a variable resistance memory device, the method including forming a bottom electrode material layer on a substrate that includes a first memory region and a second memory region; forming a first variable resistance material layer on the bottom electrode material layer; forming a first top electrode material layer on the first variable resistance material layer; removing the first variable resistance material layer and the first top electrode material layer on the second memory region; forming a second variable resistance material layer on the substrate; forming a second top electrode material layer on the second variable resistance material layer; removing the second variable resistance material layer and the second top electrode material layer on the first memory region; and patterning the bottom electrode material layer, the first variable resistance material layer, the second variable resistance material layer and the first and second top electrode material layers, which remain on the substrate, to form first memory cells on the first memory region and second memory cells on the second memory region, wherein removing the second variable resistance material layer and the second top electrode material layer on the first memory region includes performing a planarization process to expose the first top electrode material layer on the first memory region, and the first variable resistance material layer includes a material of which a maximum resistance value is different from that of a material of the second variable resistance material layer.

BRIEF DESCRIPTION OF THE DRAWINGS

Features will be apparent to those of skill in the art by describing in detail exemplary embodiments with reference to the attached drawings in which:

FIGS. 7A to 7F illustrate cross-sectional views of stages in a method of manufacturing a variable resistance memory device according to some embodiments.

DETAILED DESCRIPTION

Variable resistance memory devices and methods of manufacturing the same according to embodiments will be described hereinafter in detail with reference to the accompanying drawings.

Figure 1:
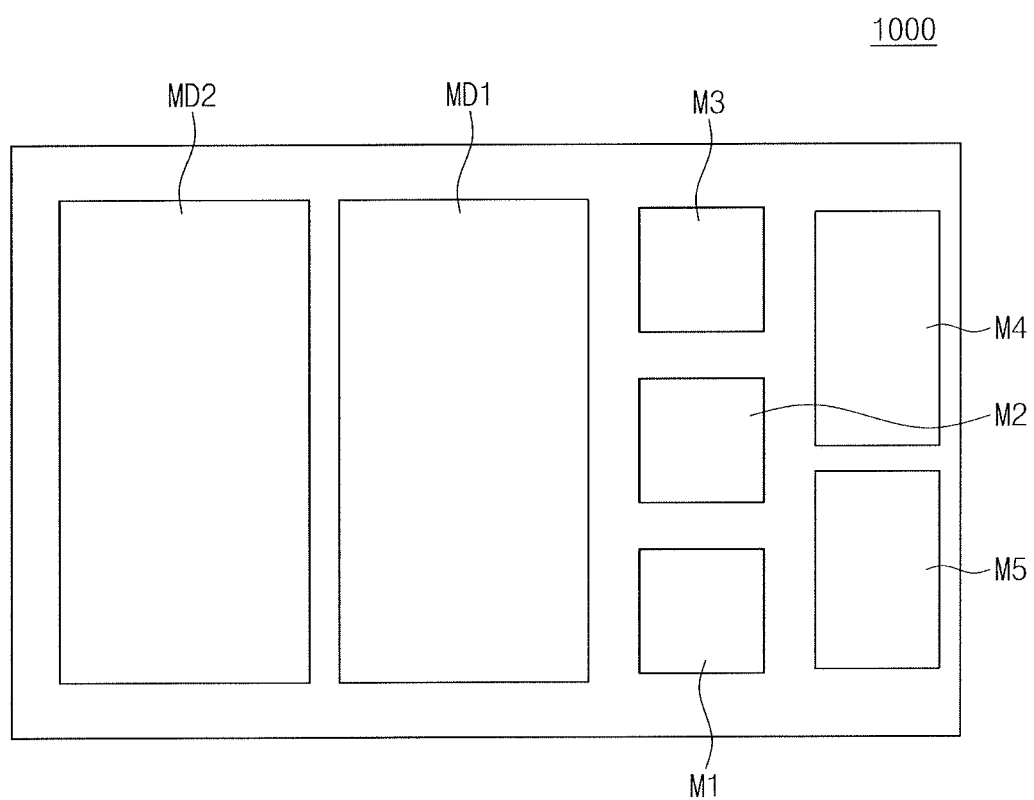
FIG. 1 illustrates a schematic block diagram of a variable resistance memory device according to some embodiments.

FIG. 1 illustrates a schematic block diagram of a variable resistance memory device according to some embodiments.

Referring to FIG. 1, a variable resistance memory device 1000 according to some embodiments may include a first memory device MD1 and a second memory device MD2. The first memory device MD1 may include a metal oxide resistance element or an interfacial operation resistance element. A read/write latency of the first memory device MD1 may range from hundreds of ns (nanoseconds) to several μs (microseconds) or more. The first memory device MD1 may have similar characteristics to those of a flash memory device.

The second memory device MD2 may include a magnetic resistance element, a phase change element, or a metal oxide resistance element. A read/write latency of the second memory device MD2 may range from several ns to several tens of ns or more. For example, the second memory device MD2 may have similar characteristics to those of a SRAM device or a DRAM device.

A retention characteristic of the first memory device MD1 may be greater than that of the second memory device MD2, and an operating speed of the first memory device MD1 may be less than that of the second memory device MD2. The second memory device MD2 may be used as a buffer supplementing relatively low speed and performance of the first memory device MD1, and thus efficiency of the variable resistance memory device 1000 may be improved or increased.

The variable resistance memory device 1000 may further include an EPROM M1, a central processing unit (CPU) M2, an input/output (I/O) M3, a serial interface M4, and a timer M5. For example, the variable resistance memory device 1000 may be formed or realized as one of various semiconductor devices including the first and second memory devices MD1 and MD2. The variable resistance memory device 1000 may be formed as a single independent memory chip.

Figure 2:
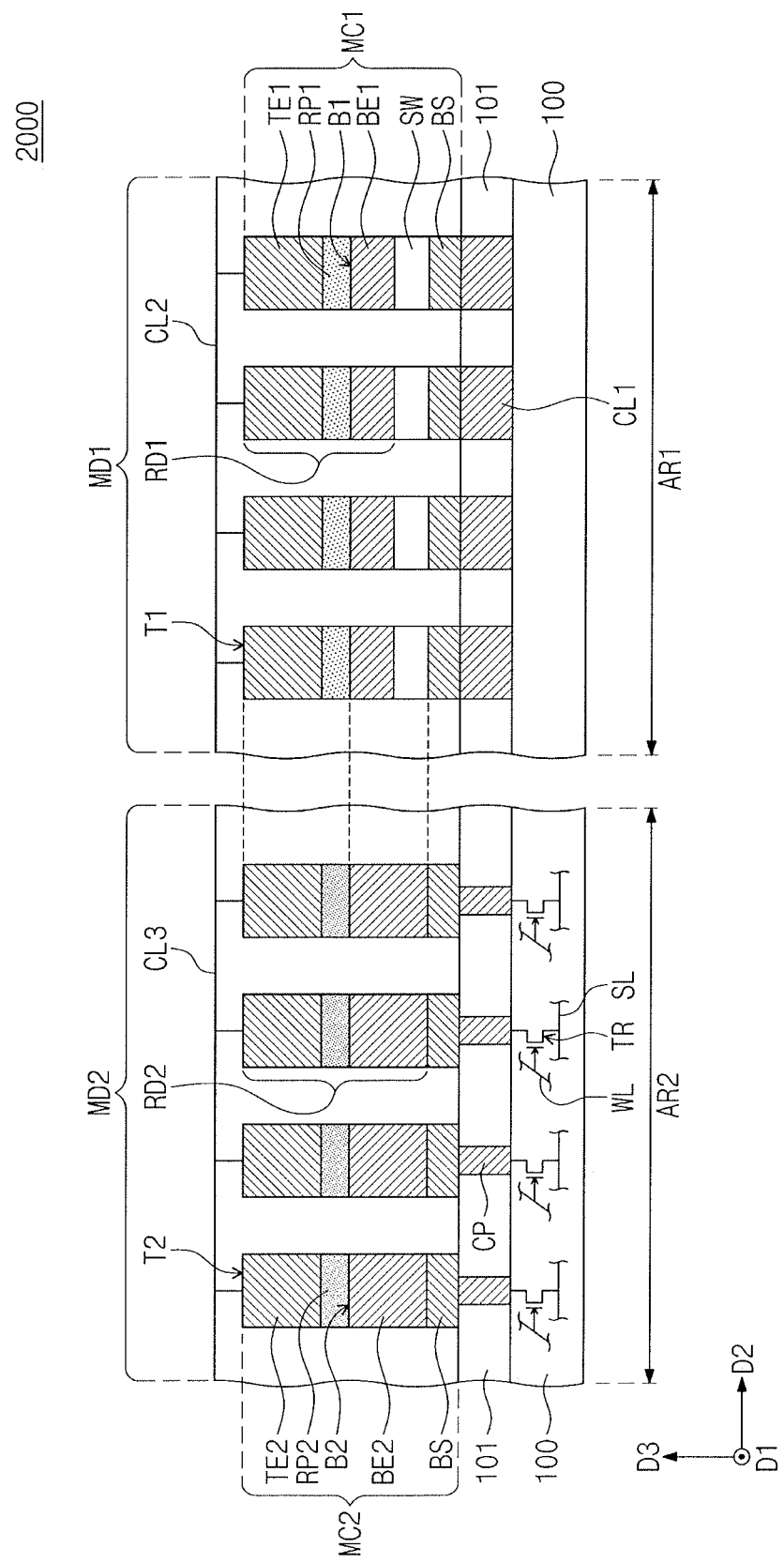
FIG. 2 illustrates a cross-sectional view of a variable resistance memory device according to some embodiments.

FIG. 2 illustrates a cross-sectional view of a variable resistance memory device according to some embodiments.

Referring to FIG. 2, a variable resistance memory device 2000 according to some embodiments may include a substrate 100, a first memory device MD1, and a second memory device MD2. The substrate 100 may include a first memory region AR1 and a second memory region AR2.

An interlayer insulating layer 101 may be on the substrate 100, and a plurality of first conductive lines CL1 may be in the interlayer insulating layer 101 on the first memory region AR1. The plurality of first conductive lines CL1 may be, e.g., word lines or bit lines. Each of the first conductive lines CL1 may extend in a first direction D1 parallel to a top surface of the substrate 100. In an implementation, top surfaces of the first conductive lines CL1 may be coplanar with a top surface of the interlayer insulating layer 101.

The first memory device MD1 may be on the first memory region AR1. The first memory device MD1 may include a plurality of first memory cells MC1. The first memory cells MC1 may be spaced apart from each other in a second direction D2 which is parallel to the top surface of the substrate 100 and is perpendicular to the first direction D1.

Each of the first memory cells MC1 may include a first resistance element RD1 and a selection element SW. Each of the first memory cells MC1 may further include a sub-bottom electrode BS. The sub-bottom electrode BS, the selection element SW, and the first resistance element RD1 may be sequentially stacked in a third direction D3 perpendicular to the top surface of the substrate 100. The sub-bottom electrode BS may include a single metal electrode layer or a plurality of metal electrode layers.

The selection element SW may be an element based on a threshold switching phenomenon having a nonlinear I-V curve (e.g., a S-shaped I-V curve). In an implementation, the selection element SW may include, e.g., an ovonic threshold switch (OTS) element having a bi-directional characteristic, a PN diode, or a mixed ionic electronic conductor (MIEC). The selection element SW may include a chalcogenide material. The chalcogenide material may include a compound which includes a chalcogen element (e.g., Te and/or Se) and at least one of Ge, Sb, Bi, Al, Pb, Sn, Ag, As, S, Si, In, Ti, Ga, or P. In an implementation, the selection element SW may further include an impurity, e.g., C, N, B, or O. As used herein, the term "or" is not an exclusive term, e.g., "A or B" could include A, B, or A and B.

Each of the first memory cells MC1 may be at a crossing point of the first conductive line CL1 and a second conductive line CL2 to be described below, thereby forming a cross point structure. In this case, the selection element SW may help inhibit a leakage current occurring in the cross point structure.

The first resistance element RD1 may include a first bottom electrode BE1, a first variable resistance pattern RP1, and a first top electrode TE1, which are sequentially stacked in the third direction D3.

The first bottom electrode BE1 and the first top electrode TE1 may independently include, e.g., W, Pt, Ru, Ti, Hf, Zr, Ta, an oxide thereof, or a nitride thereof. Each of the first bottom electrode BE1 and the first top electrode TE1 may include a single layer or a plurality of layers. The plurality of layers may include different kinds of layers including Ti and/or W. In an implementation, the different kinds of layers may include, e.g., Ti/TiN, Ti/TiN/W, or WN/W.

The first bottom electrode BE1 and the first top electrode TE1 may include the same material or may include different materials.

The first variable resistance pattern RP1 may be an element of which a state is changed from a high-resistance state into a low-resistance state by a voltage or is changed from the low-resistance state into the high-resistance state by a voltage. The first variable resistance pattern RP1 may include an oxide (e.g., a metal oxide) including Ti, Zr, Al, Hf, or Si. The first variable resistance pattern RP1 may have a single-layered structure. In an implementation, the first variable resistance pattern RP1 may have a barrier shape or a multi-layered structure (e.g., a double-layered structure or more), depending on an intended use. For example, the first variable resistance pattern RP1 may have the barrier shape to adjust operating voltage and current or may have the multi-layered structure to improve switching ability.

The second conductive line CL2 may be on the first memory device MD1. The second conductive line CL2 may extend in the second direction D2. The second conductive line CL2 may be electrically connected to the first memory cells MC1. The second conductive line CL2 may be, e.g., a word line or a bit line. The first conductive line CL1 and the second conductive line CL2 may intersect each other when viewed in a plan view. The first conductive line CL1, the first memory cell MC1 and the second conductive line CL2 may constitute the cross point structure. In an implementation, as illustrated in FIG. 2, the structure (1S1R) may be one in which one first resistance element RD1 and one selection element SW are electrically connected to each other.

In an implementation, a transistor TR, a source line SL, a word line WL and other semiconductor component may be provided in the second memory region AR2.

A plurality of conductive patterns CP may be provided in the interlayer insulating layer 101 on the second memory region AR2. In an implementation, top surfaces of the conductive patterns CP (e.g., surfaces facing away from the substrate 100) may be coplanar with the top surface of the interlayer insulating layer 101. The plurality of conductive patterns CP may transmit electrical signals between the transistors TR and second memory cells MC2 to be described below. In an implementation, as illustrated in FIG. 2, each of the second memory cells MC2 may be connected to each of the transistors TR (1T1R). In an implementation, the number of the connected transistor TR may be different from that illustrated.

The second memory device MD2 may include a plurality of the second memory cells MC2. The second memory cells MC2 may be spaced apart from each other in the second direction D2.

Each of the second memory cells MC2 may include a second resistance element RD2. Each of the second memory cells MC2 may further include a sub-bottom electrode BS. The sub-bottom electrode BS and the second resistance element RD2 may be sequentially stacked in the third direction D3.

The second resistance element RD2 may include a second bottom electrode BE2, a second variable resistance pattern RP2, and a second top electrode TE2, which are sequentially stacked in the third direction D3.

The second bottom electrode BE2 and the second top electrode TE2 may independently include, e.g., W, Pt, Ru, Ti, Hf, Zr, Ta, an oxide thereof, or a nitride thereof. Each of the second bottom electrode BE2 and the second top electrode TE2 may include a single layer or a plurality of layers. The plurality of layers may include different kinds of layers including Ti and/or W. In an implementation, the different kinds of layers may include Ti/TiN, Ti/TiN/W, or WN/W.

The second bottom electrode BE2 and the second top electrode TE2 may include the same material or may include different materials.

The second variable resistance pattern RP2 may be an element of which a state is changed from a high-resistance state into a low-resistance state by a voltage or is changed from the low-resistance state into the high-resistance state by a voltage. The second variable resistance pattern RP2 may include at least one of an oxide (e.g., a metal oxide) including, e.g., Ti, Zr, Al, Hf, or Si. The second variable resistance pattern RP2 may have a single-layered structure. In an implementation, the second variable resistance pattern RP2 may have a barrier shape or a multi-layered structure (e.g., a double-layered structure or more), depending on an intended use. For example, the second variable resistance pattern RP2 may have the barrier shape to adjust operating voltage and current or may have the multi-layered structure to improve switching ability.

A third conductive line CL3 may be on the second memory device MD2. The third conductive line CL3 may be electrically connected to a plurality of the second memory cells MC2. The third conductive line CL3 may be, e.g., a bit line. The second memory device MD2 may have an embedded structure.

In an implementation, as illustrated in FIG. 2, the structure (1T1R) may be one in which one second resistance element RD2 and one transistor TR are electrically connected to each other.

In relation of the first memory device MD1 and the second memory device MD2, the second variable resistance pattern RP2 may include a different material from that of the first variable resistance pattern RP1. When the same voltage is applied to the first and second variable resistance patterns RP1 and RP2, the amount of a current flowing through the second variable resistance pattern RP2 may be more than the amount of a current flowing through the first variable resistance pattern RP1. For example, the first variable resistance pattern RP1 may have a resistance state that is greater than that of the second variable resistance pattern RP2. In an implementation, a maximum value of a variable resistance of the second resistance element RD2 may be less than a maximum value of a variable resistance of the first resistance element RD1.

A level (e.g., a height or distance from the substrate 100 in the third direction D3) of a top surface T1 of the first top electrode TE1 may be the same or substantially the same as a level of a top surface T2 of the second top electrode TE2. A level of a top surface B1 of the first bottom electrode BE1 may be the same or substantially the same as a level of a top surface B2 of the second bottom electrode BE2.

A level of a top surface of the sub-bottom electrode BS on the first memory region AR1 may be the same as a level of a top surface of the sub-bottom electrode BS on the second memory region AR2. The selection element SW may be on the first memory region AR1, and a level of a bottom (e.g., substrate-facing) surface of the first bottom electrode BE1 may be higher than a level of a bottom surface of the second bottom electrode BE2. In an implementation, a width (e.g., thickness, vertical length, or height) of the first resistance element RD1 in the third direction D3 may be less than a width (e.g., thickness, vertical length, or height) of the second resistance element RD2 in the third direction D3.

FIGS. 3A to 3I illustrate cross-sectional views of stages in a method of manufacturing a variable resistance memory device according to some embodiments.

Figure 3A:
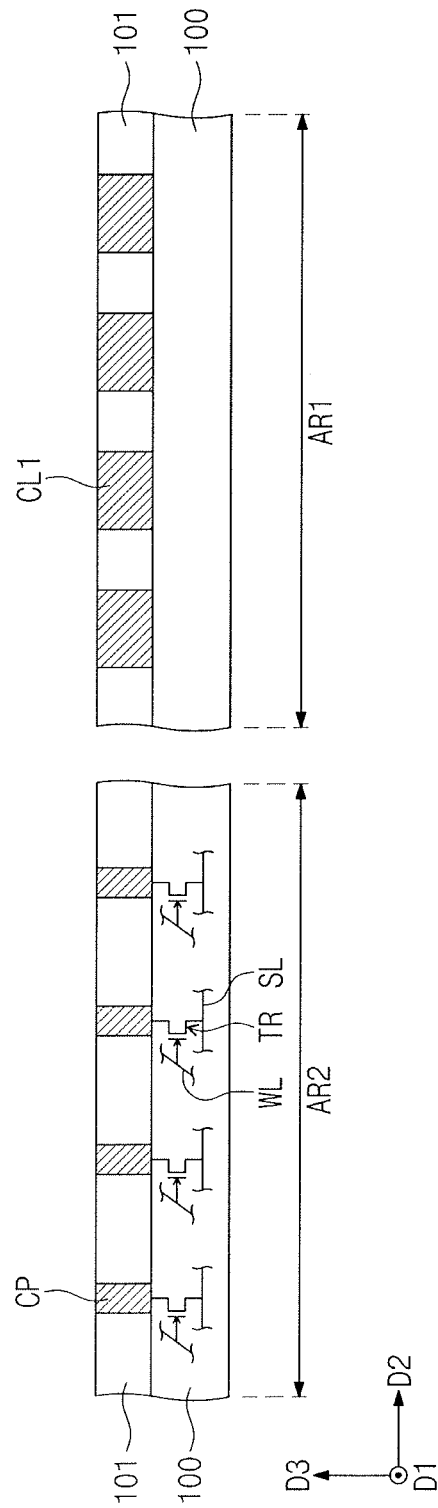
FIGS. 3A to 3I illustrate cross-sectional views of stages in a method of manufacturing a variable resistance memory device according to some embodiments.

Referring to FIG. 3A, a substrate 100 including a first memory region AR1 and a second memory region AR2 may be provided. An interlayer insulating layer 101 and first conductive lines CL1 therein may be provided on the first memory region AR1. A transistor TR, a source line SL, a word line WL and other semiconductor components may be provided in the second memory region AR2. A plurality of conductive patterns CP may be provided in the interlayer insulating layer 101 on the second memory region AR2.

Figure 3B:
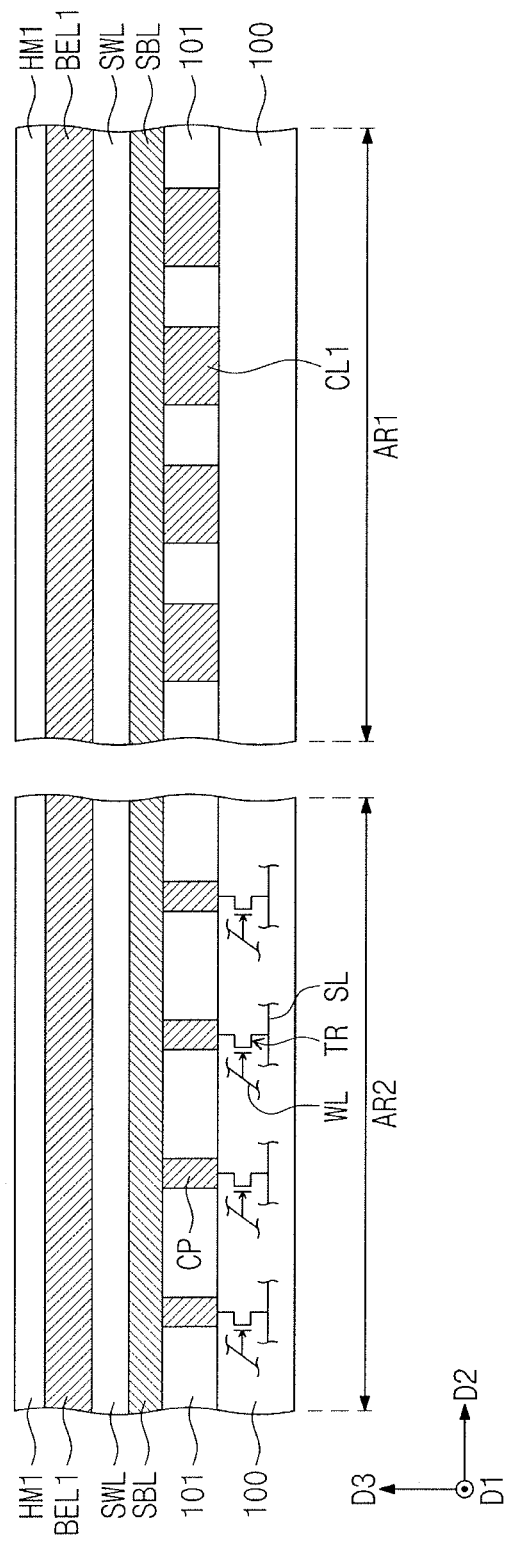

Referring to FIG. 3B, a sub-bottom electrode material layer SBL, a selection element material layer SWL, a first bottom electrode material layer BEL1, and a first hard mask layer HM1 may be sequentially deposited on the first memory region AR1 and the second memory region AR2. The first hard mask layer HM1 may include, e.g., silicon oxide, silicon nitride, a metal oxide, or a metal nitride. The selection element material layer SWL may be deposited by, e.g., an atomic layer deposition (ALD) process, a physical vapor deposition (PVD) process, or a co-sputtering process.

Figure 3C:
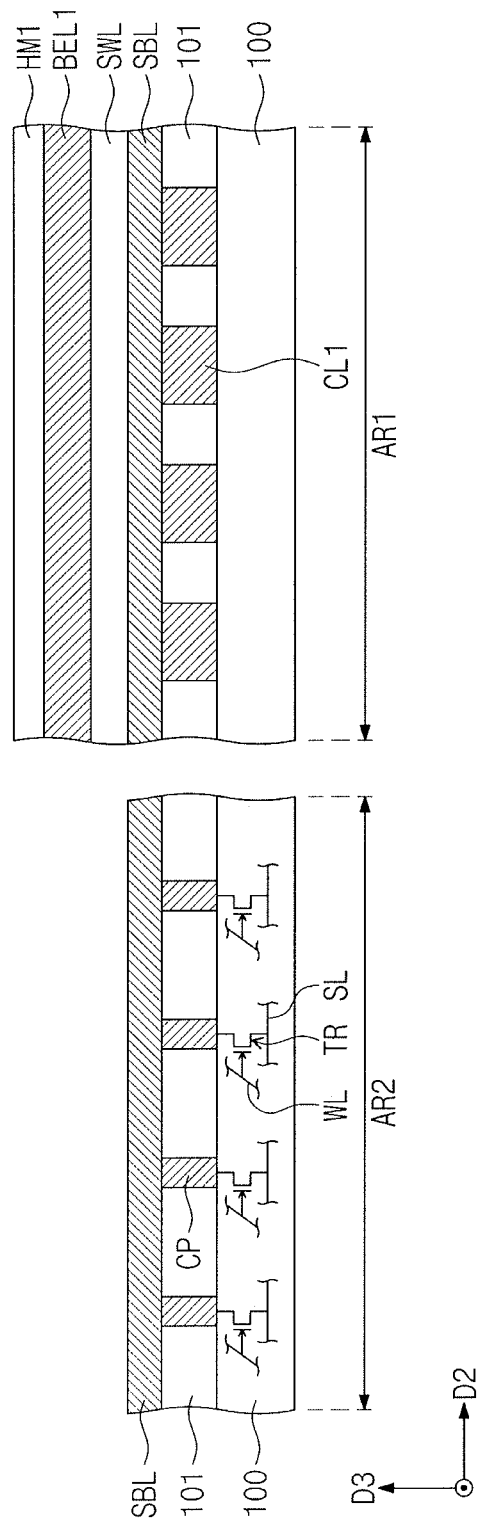

Referring to FIG. 3C, the selection element material layer SWL, the first bottom electrode material layer BEL1 and the first hard mask layer HM1 on the second memory region AR2 may be removed.

For example, a mask pattern covering the first memory region AR1 may be formed. For example, the mask pattern may be formed by coating, exposure, and development processes of a photoresist. Next, the first hard mask layer HM1, the first bottom electrode material layer BEL1, and the selection element material layer SWL on the second memory region AR2, which are not covered by the mask pattern, may be etched. At this time, a top surface of the sub-bottom electrode material layer SBL may be used as an etch stop line. As a result, the selection element material layer SWL and the first bottom electrode material layer BEL1 may remain locally on the first memory region AR1.

Figure 3D:
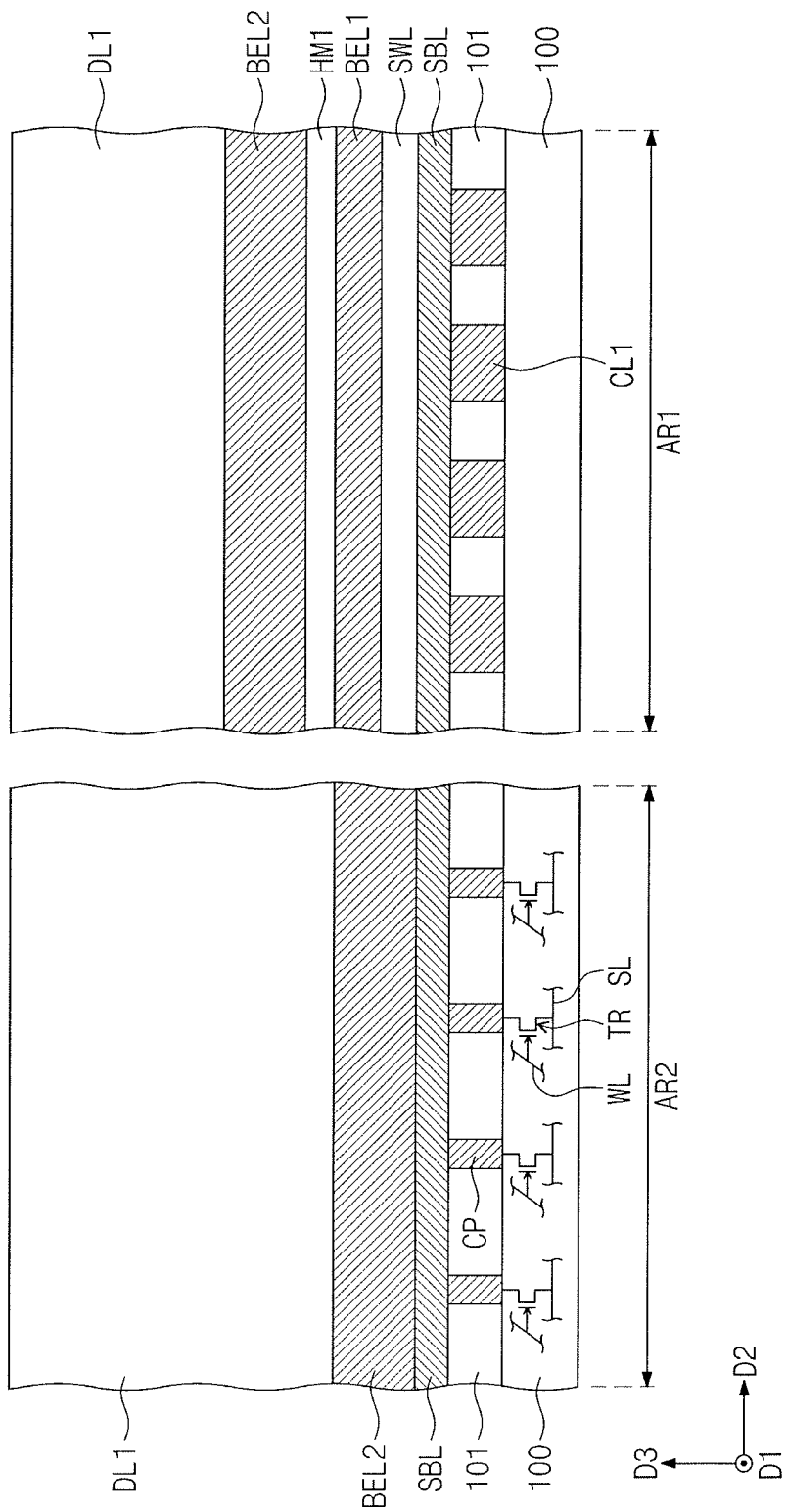

Referring to FIG. 3D, a second bottom electrode material layer BEL2 may be deposited on the first memory region AR1 and the second memory region AR2. Subsequently, a first insulating layer DL1 may be formed on the first memory region AR1 and the second memory region AR2.

The first insulating layer DL1 may be thickly deposited in such a way that a height difference hardly occurs between a top surface of the first insulating layer DL1 on the first memory region AR1 and a top surface of the first insulating layer DL1 on the second memory region AR2.

Figure 3E:
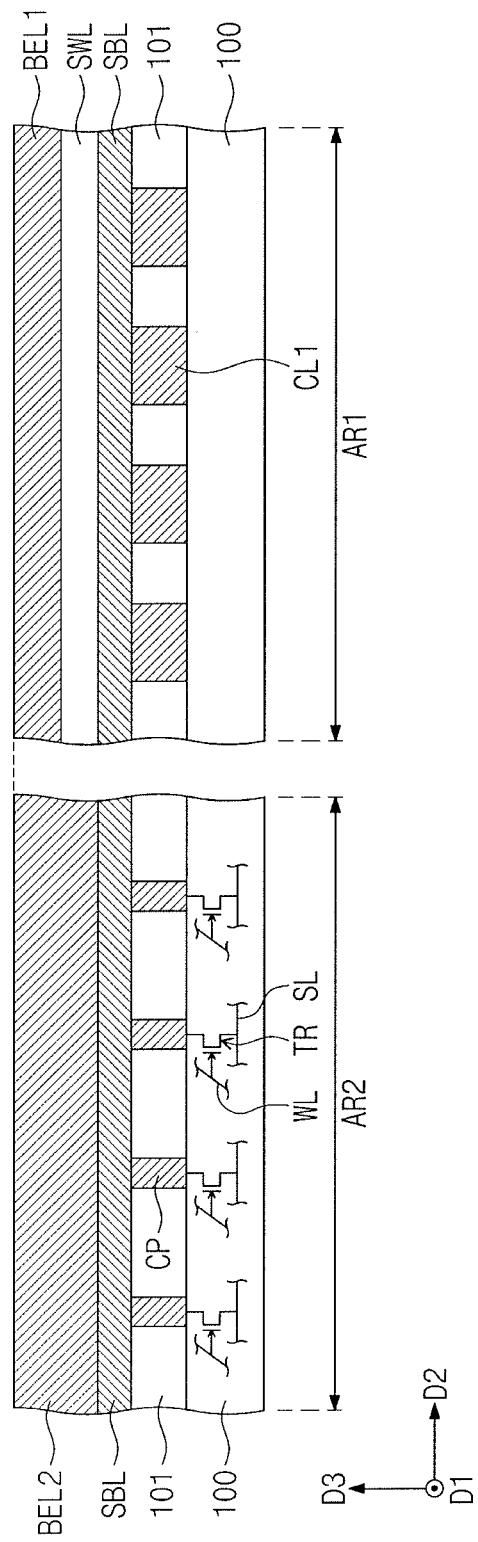

Referring to FIG. 3E, a planarization process may be performed on the first memory region AR1 and the second memory region AR2. For example, the planarization process may include a chemical mechanical polishing (CMP) process. A bottom surface of the first hard mask layer HM1 on the first memory region AR1 may be used as a stop line of the planarization process.

The first bottom electrode material layer BEL1 on the first memory region AR1 and the second bottom electrode material layer BEL2 on the second memory region AR2 may be exposed to the outside by the planarization process. In addition, due to the planarization process, a level of a top surface of the first bottom electrode material layer BEL1 on the first memory region AR1 may be substantially the same as a level of a top surface of the second bottom electrode material layer BEL2 on the second memory region AR2 (e.g., the top surface of the first bottom electrode material layer BEL1 on the first memory region AR1 may be substantially coplanar with the top surface of the second bottom electrode material layer BEL2 on the second memory region AR2).

Figure 3F:
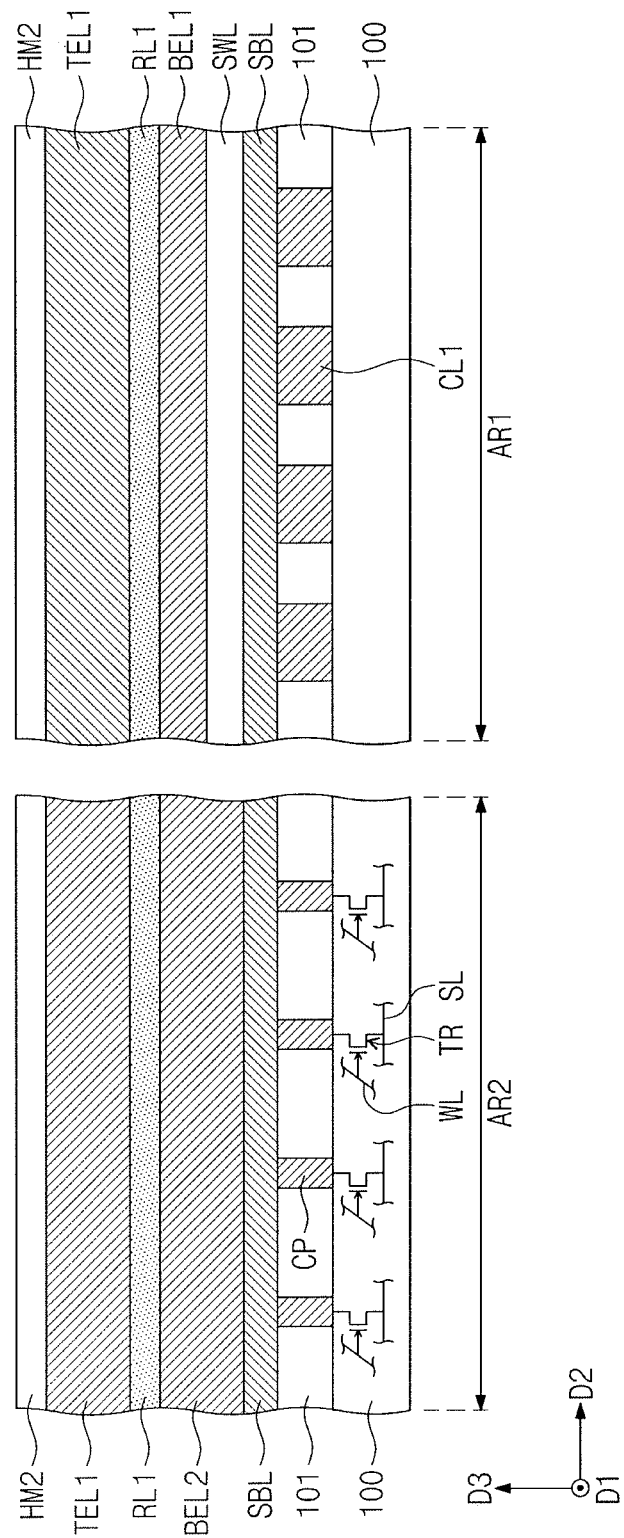

Referring to FIG. 3F, a first variable resistance material layer RL1, a first top electrode material layer TEL1 and a second hard mask layer HM2 may be sequentially deposited on the first memory region AR1 and the second memory region AR2. The second hard mask layer HM2 may be formed of, e.g., silicon oxide, silicon nitride, a metal oxide, or a metal nitride by a deposition process.

Figure 3G:
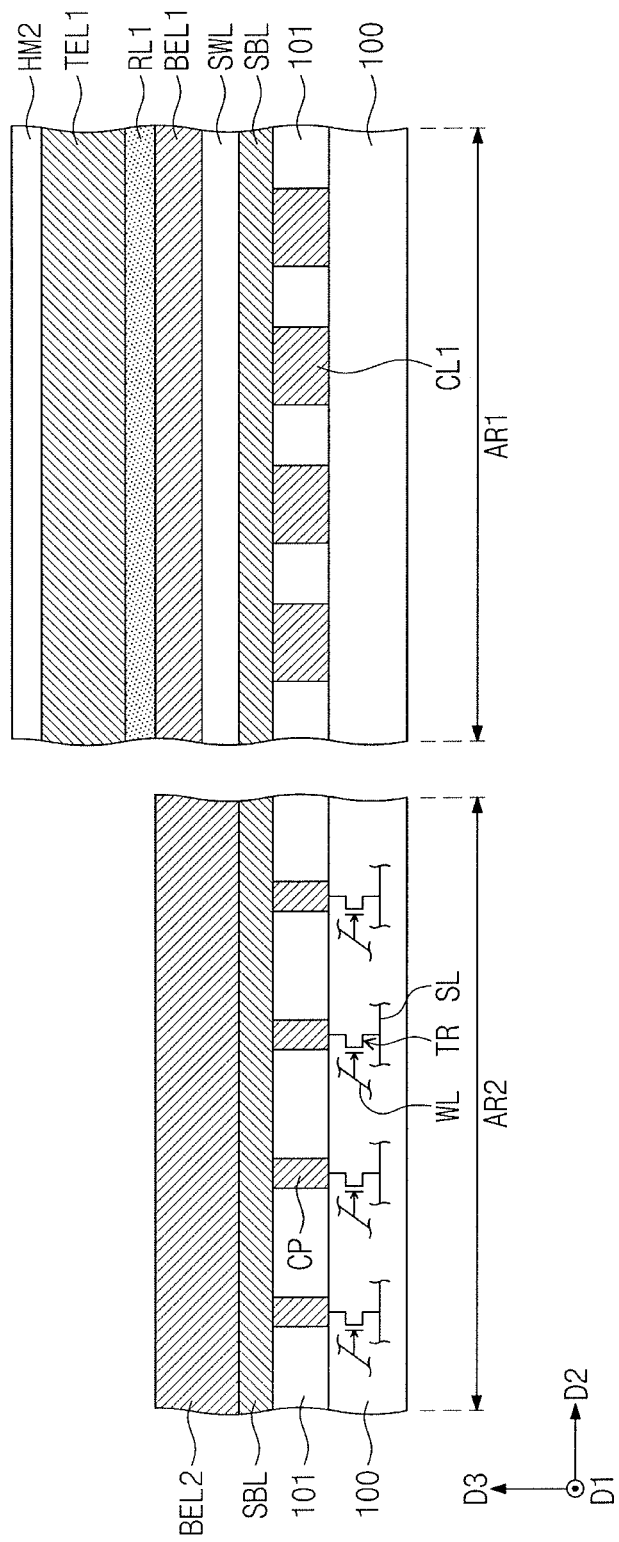

Referring to FIG. 3G, the first variable resistance material layer RL1, the first top electrode material layer TEL1, and the second hard mask layer HM2 on the second memory region AR2 may be etched. For example, a mask pattern covering the first memory region AR1 may be formed. For example, the mask pattern may be formed by coating, exposure, and development processes of a photoresist. Next, the second hard mask layer HM2, the first top electrode material layer TEL1, and the first variable resistance material layer RL1 on the second memory region AR2, which are not covered by the mask pattern, may be etched. As a result, the first variable resistance material layer RL1 and the first top electrode material layer TEL1 may remain locally on the first memory region AR1.

Figure 3H:
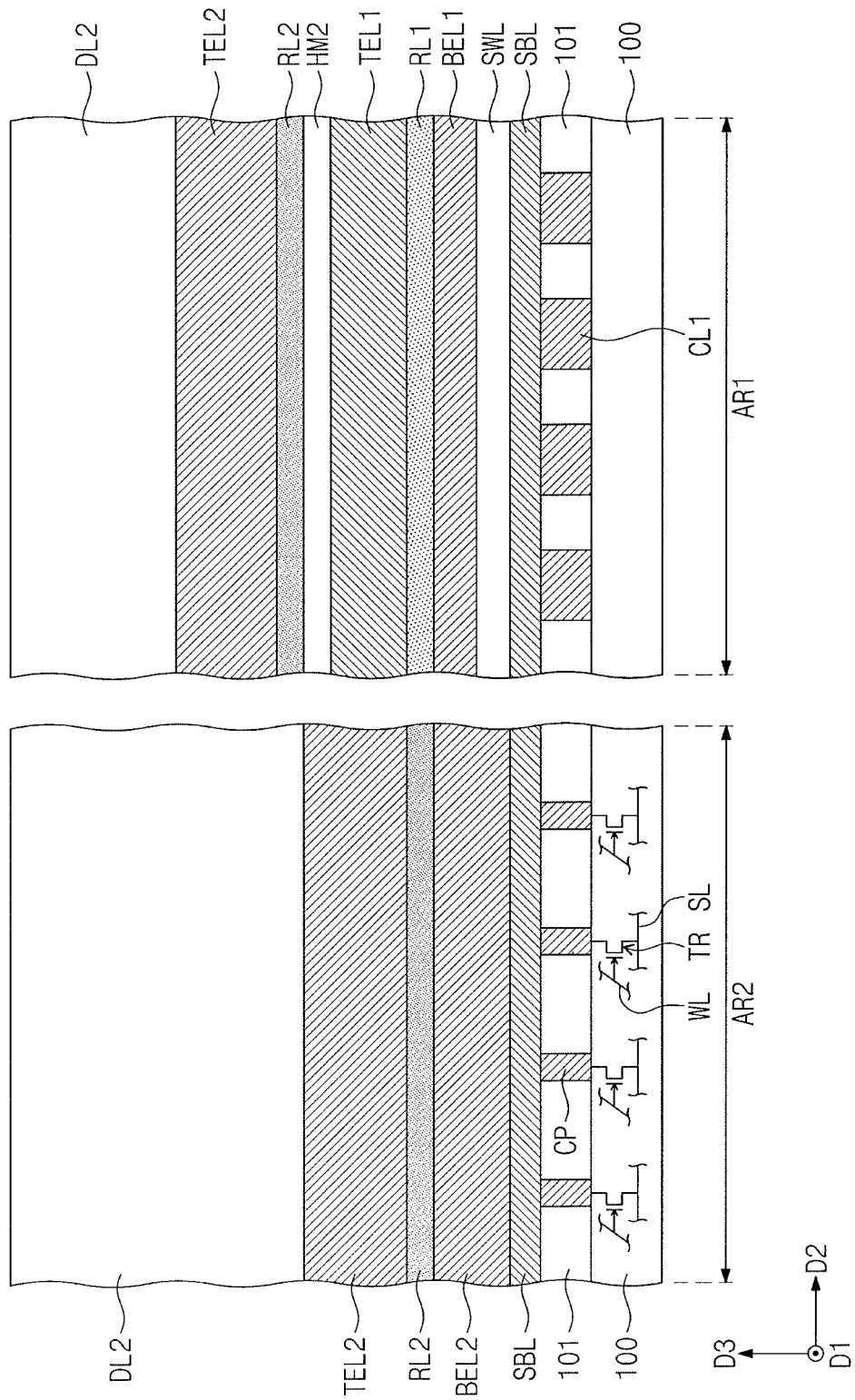

Referring to FIG. 3H, a second variable resistance material layer RL2, a second top electrode material layer TEL2, and a second insulating layer DL2 may be sequentially formed on the first memory region AR1 and the second memory region AR2. The second insulating layer DL2 may be thickly formed in such a way that a level (or height) difference hardly occurs between a top surface of the second insulating layer DL2 on the first memory region AR1 and a top surface of the second insulating layer DL2 on the second memory region AR2.

Figure 3I:
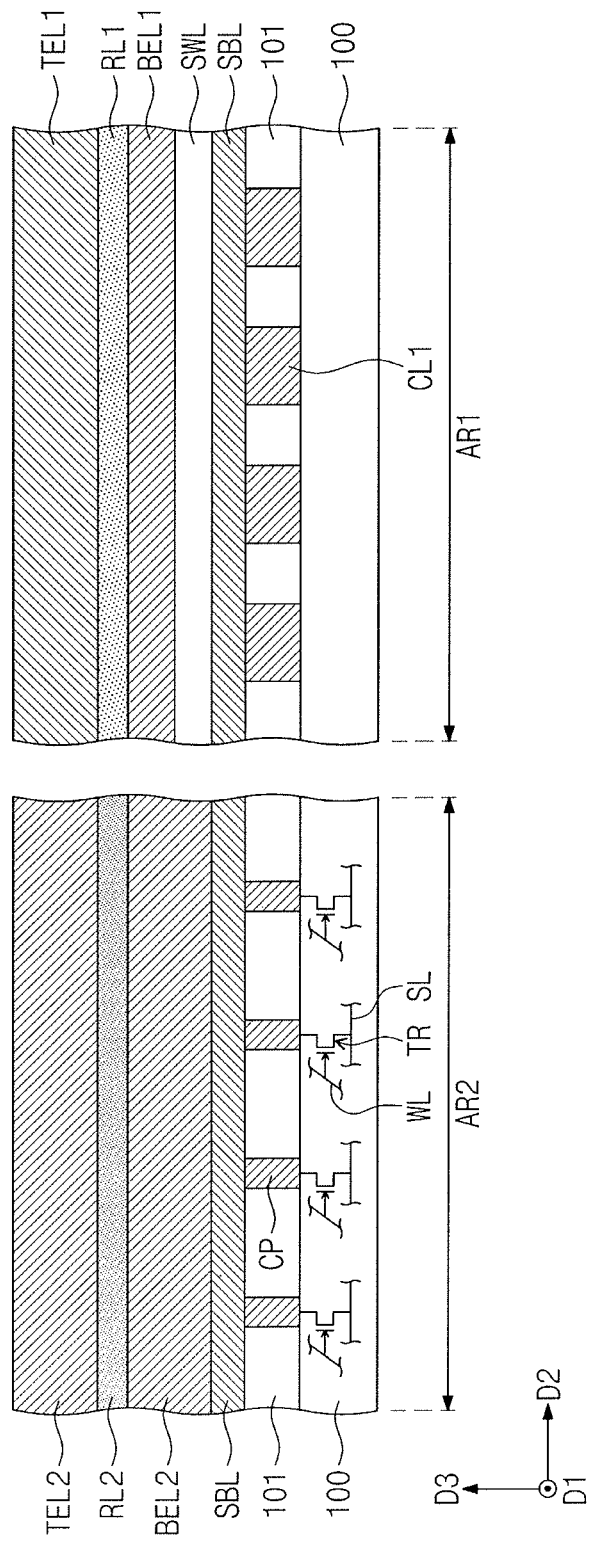

Referring to FIG. 3I, a planarization process may be performed on the first memory region AR1 and the second memory region AR2. For example, the planarization process may include a chemical mechanical polishing (CMP) process. A bottom surface of the second hard mask layer HM2 on the first memory region AR1 may be used as a stop line of the planarization process. The first top electrode material layer TEL1 on the first memory region AR1 and the second top electrode material layer TEL2 on the second memory region AR2 may be exposed by the planarization process. The planarization process may be performed until a level of a top surface of the first top electrode material layer TEL1 on the first memory region AR1 is substantially the same as a level of a top surface of the second top electrode material layer TEL2 on the second memory region AR2.

Referring again to FIG. 2, a cell patterning process may be performed on the first memory region AR1 and the second memory region AR2 at the same time. For example, the cell patterning process may be performed using a photolithography process for forming mask patterns and an etching process. The sub-bottom electrode material layer SBL, the selection element material layer SWL, the first bottom electrode material layer BEL1, the first variable resistance material layer RL1, and the first top electrode material layer TEL1 on the first memory region AR1 may be formed into a plurality of first memory cells MC1 through the cell patterning process.

The sub-bottom electrode material layer SBL, the second bottom electrode material layer BEL2, the second variable resistance material layer RL2, and the second top electrode material layer TEL2 on the second memory region AR2 may be formed into a plurality of second memory cells MC2 through the cell patterning process.

In addition, a second conductive line CL2 electrically connected to the first memory cells MC1 may be formed, and a third conductive line CL3 electrically connected to the second memory cells MC2 may be formed.

Figure 4:
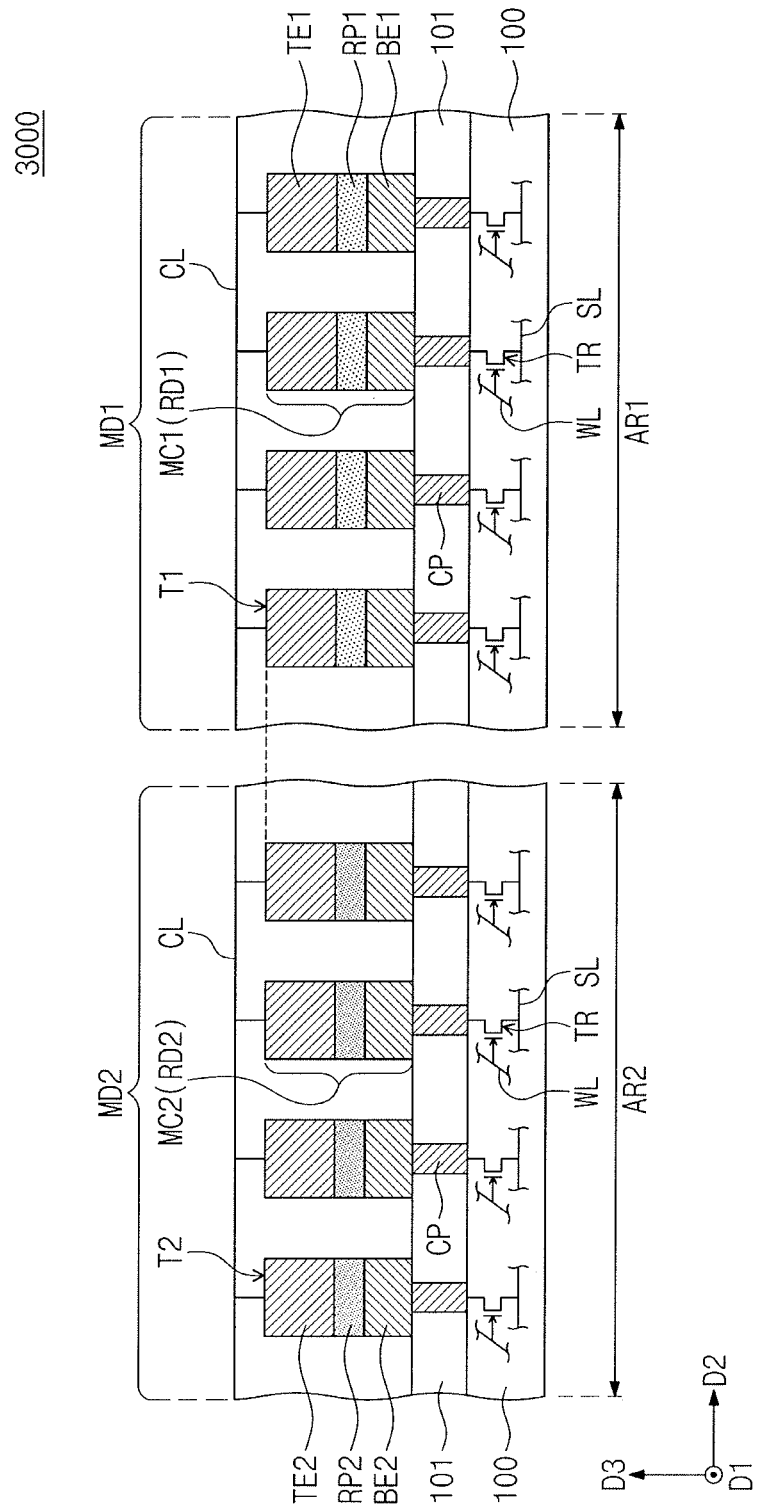
FIG. 4 illustrates a cross-sectional view of a variable resistance memory device according to some embodiments.

FIG. 4 illustrates a cross-sectional view of a variable resistance memory device according to some embodiments. Hereinafter, repeated descriptions to the same components and features as mentioned with reference to FIG. 2 may be omitted for the purpose of ease and convenience in explanation.

Referring to FIG. 4, a variable resistance memory device 3000 according to the present embodiments may include a substrate 100, a first memory device MD1, and a second memory device MD2.

The substrate 100 may include a first memory region AR1 and a second memory region AR2. Transistors TR, source lines SL and word lines WL may be provided in the first memory region AR1 and the second memory region AR2.

A plurality of conductive patterns CP may be provided in an interlayer insulating layer 101 on the substrate 100. In an implementation, top surfaces of the conductive patterns CP may be coplanar with a top surface of the interlayer insulating layer 101.

The first memory device MD1 may include a plurality of first memory cells MC1. Each of the first memory cells MC1 may include a first resistance element RD1. The first resistance element RD1 may include a first bottom electrode BEL a first variable resistance pattern RP1, and a first top electrode TE1, which are sequentially stacked in the third direction D3.

A conductive line CL may be provided on the first memory device MD1.

The second memory device MD2 may include a plurality of second memory cells MC2. Each of the second memory cells MC2 may include a second resistance element RD2. The second resistance element RD2 may include a second bottom electrode BE2, a second variable resistance pattern RP2, and a second top electrode TE2, which are sequentially stacked in the third direction D3.

A conductive line CL may be provided on the second memory device MD2.

In relation of the first memory device MD1 and the second memory device MD2, the second variable resistance pattern RP2 may include a different material from that of the first variable resistance pattern RP1. For example, when the same voltage is applied to the first and second variable resistance patterns RP1 and RP2, the amount of a current flowing through the second variable resistance pattern RP2 may be greater than the amount of a current flowing through the first variable resistance pattern RP1. For example, the first variable resistance pattern RP1 may have a resistance state that is greater than that of the second variable resistance pattern RP2. In an implementation, the maximum value of a variable resistance of the second resistance element RD2 may be less than the maximum value of a variable resistance of the first resistance element RD1.

A level of a top surface T1 of the first top electrode TE1 may be the same or substantially the same as a level of a top surface T2 of the second top electrode TE2.

FIGS. 5A to 5F illustrate cross-sectional views of stages in a method of manufacturing a variable resistance memory device according to some embodiments. Hereinafter, repeated descriptions to the same components and features as mentioned with reference to FIGS. 3A to 3I may be omitted for the purpose of ease and convenience in explanation.

Figure 5A:
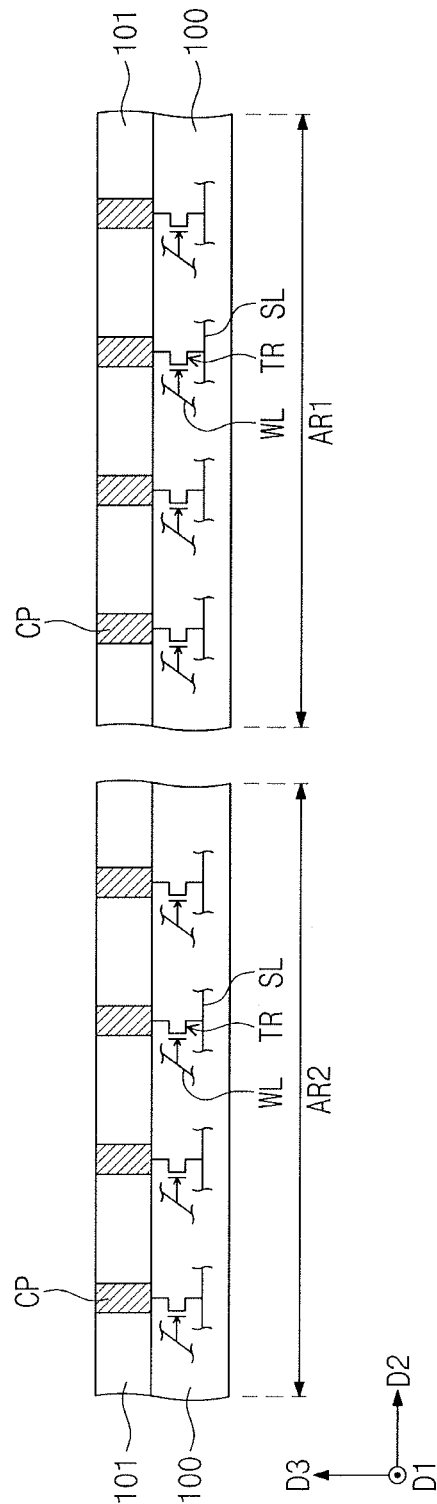
FIGS. 5A to 5F illustrate cross-sectional views of stages in a method of manufacturing a variable resistance memory device according to some embodiments.

Referring to FIG. 5A, a substrate 100 (including a first memory region AR1 and a second memory region AR2) may be provided. Transistors TR, source lines SL and word lines WL may be provided in the first memory region AR1 and the second memory region AR2. A plurality of conductive patterns CP may be provided in an interlayer insulating layer 101 on the substrate 100.

Figure 5B:
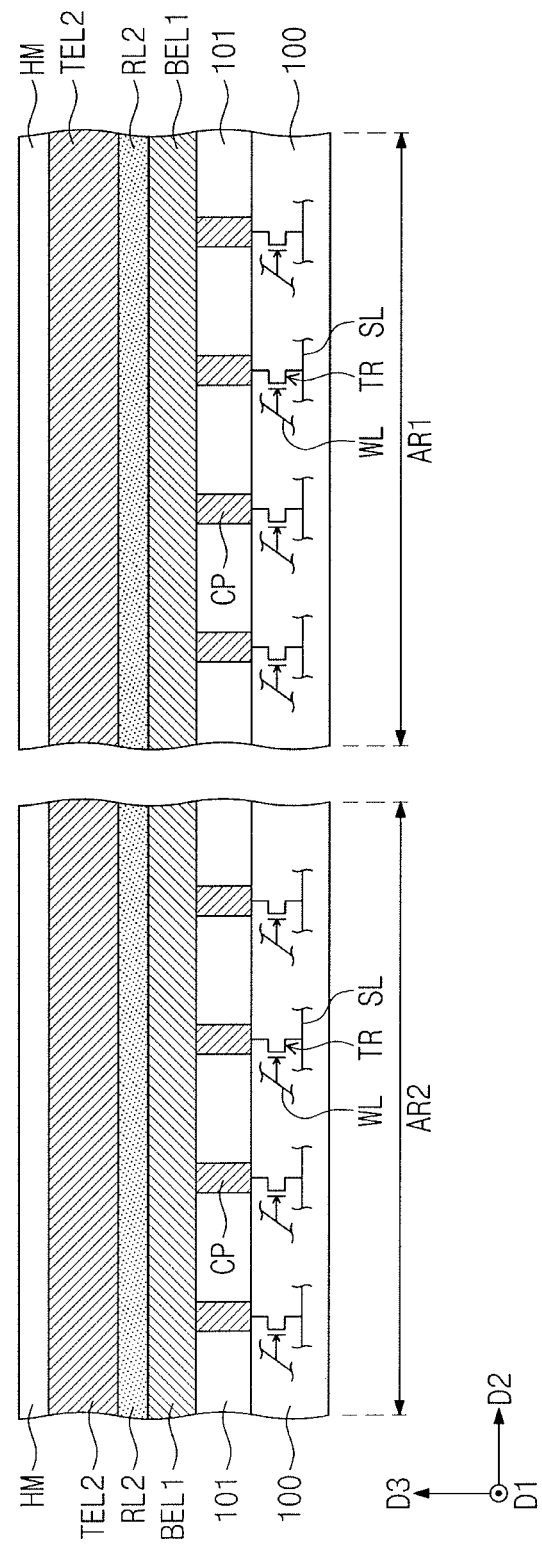

Referring to FIG. 5B, a first bottom electrode material layer BEL1, a second variable resistance material layer RL2, a second top electrode material layer TEL2, and a hard mask layer HM may be sequentially deposited on the first memory region AR1 and the second memory region AR2.

Figure 5C:
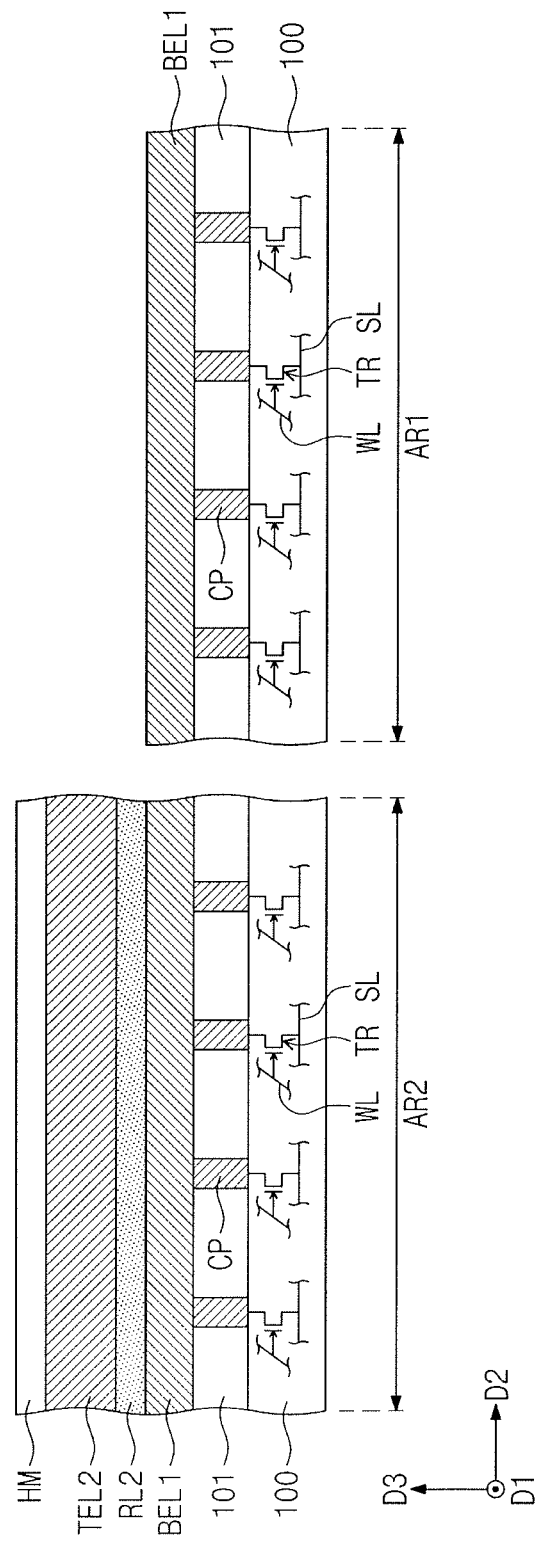

Referring to FIG. 5C, the hard mask layer HM, the second top electrode material layer TEL2, and the second variable resistance material layer RL2 on the first memory region AR1 may be removed.

Figure 5D:
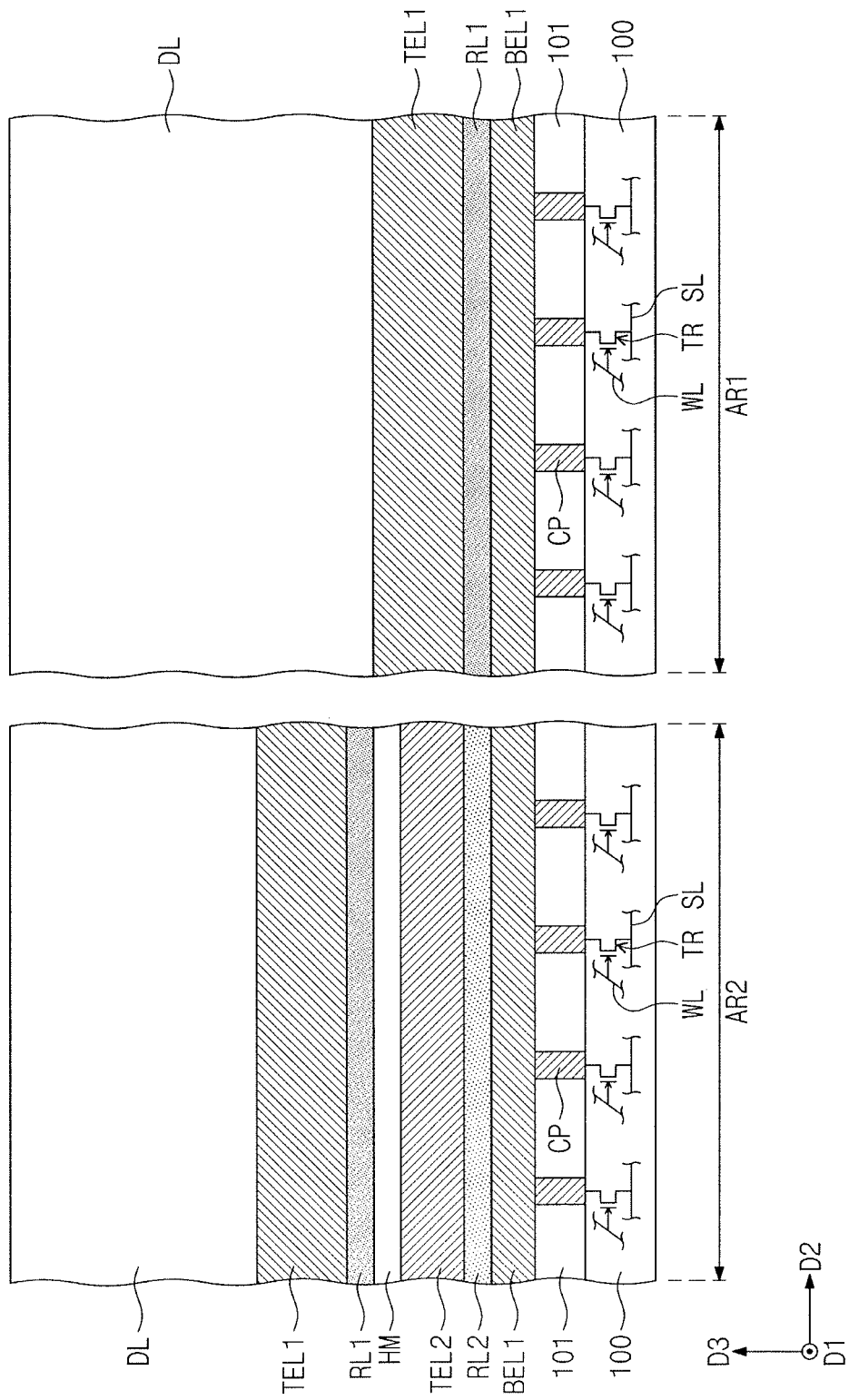

Referring to FIG. 5D, a first variable resistance material layer RL1, a first top electrode material layer TEL1, and an insulating layer DL may be sequentially formed on the first memory region AR1 and the second memory region AR2. The insulating layer DL may be thickly deposited in such a way that a height difference hardly occurs between a top surface of the insulating layer DL on the first memory region AR1 and a top surface of the insulating layer DL on the second memory region AR2.

Figure 5E:
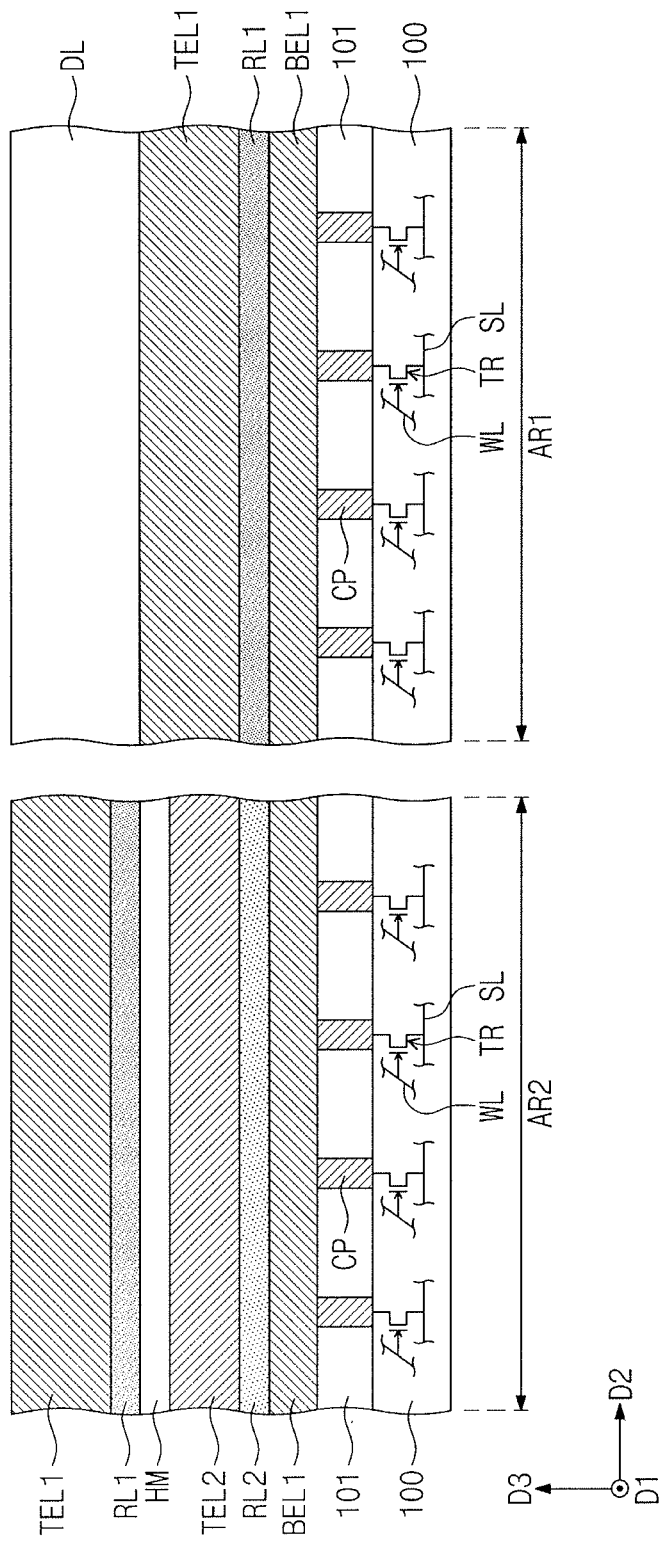

Referring to FIG. 5E, a planarization process may be performed on the insulating layer DL on the first memory region AR1 and the second memory region AR2. When the first top electrode material layer TEL1 on the second memory region AR2 is exposed, a portion of the insulating layer DL may remain on the first memory region AR1.

Figure 5F:
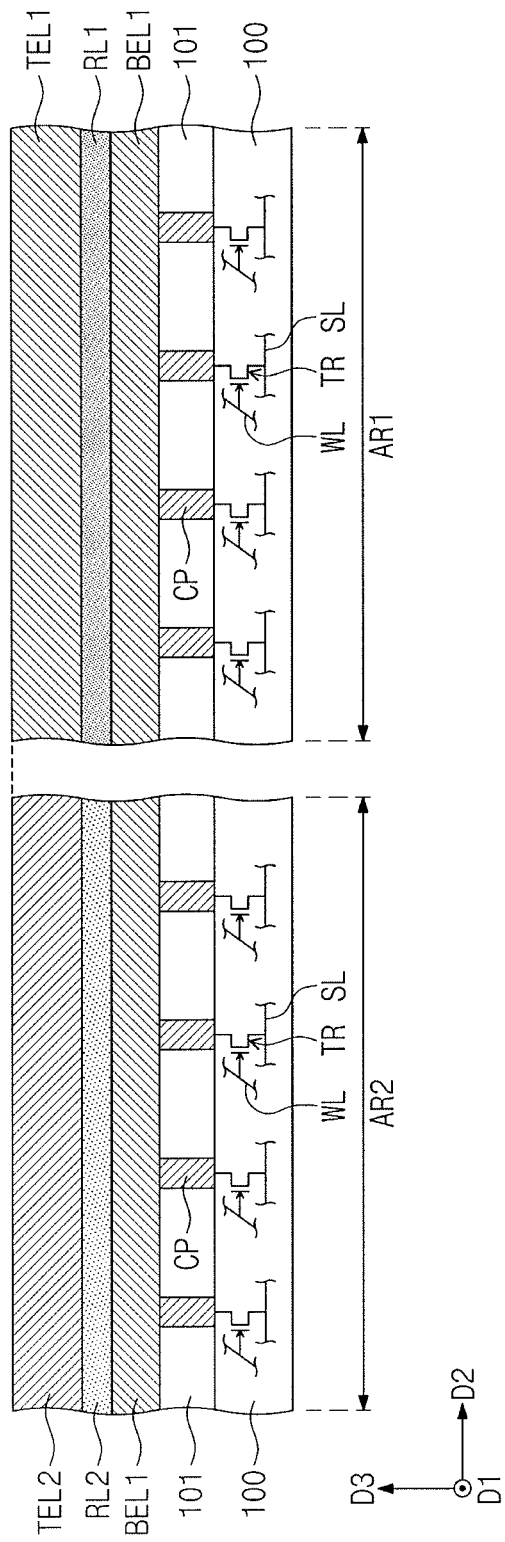

Referring to FIG. 5F, the planarization process may further be performed on the first memory region AR1 and the second memory region AR2. A bottom surface of the hard mask layer HM may be used as a stop line of the planarization process.

The first top electrode material layer TEL1 on the first memory region AR1 and the second top electrode material layer TEL2 on the second memory region AR2 may be exposed to the outside by the planarization process. In addition, a level of a top surface of the first top electrode material layer TEL1 on the first memory region AR1 may be substantially the same as a level of a top surface of the second top electrode material layer TEL2 on the second memory region AR2.

Figure 6:
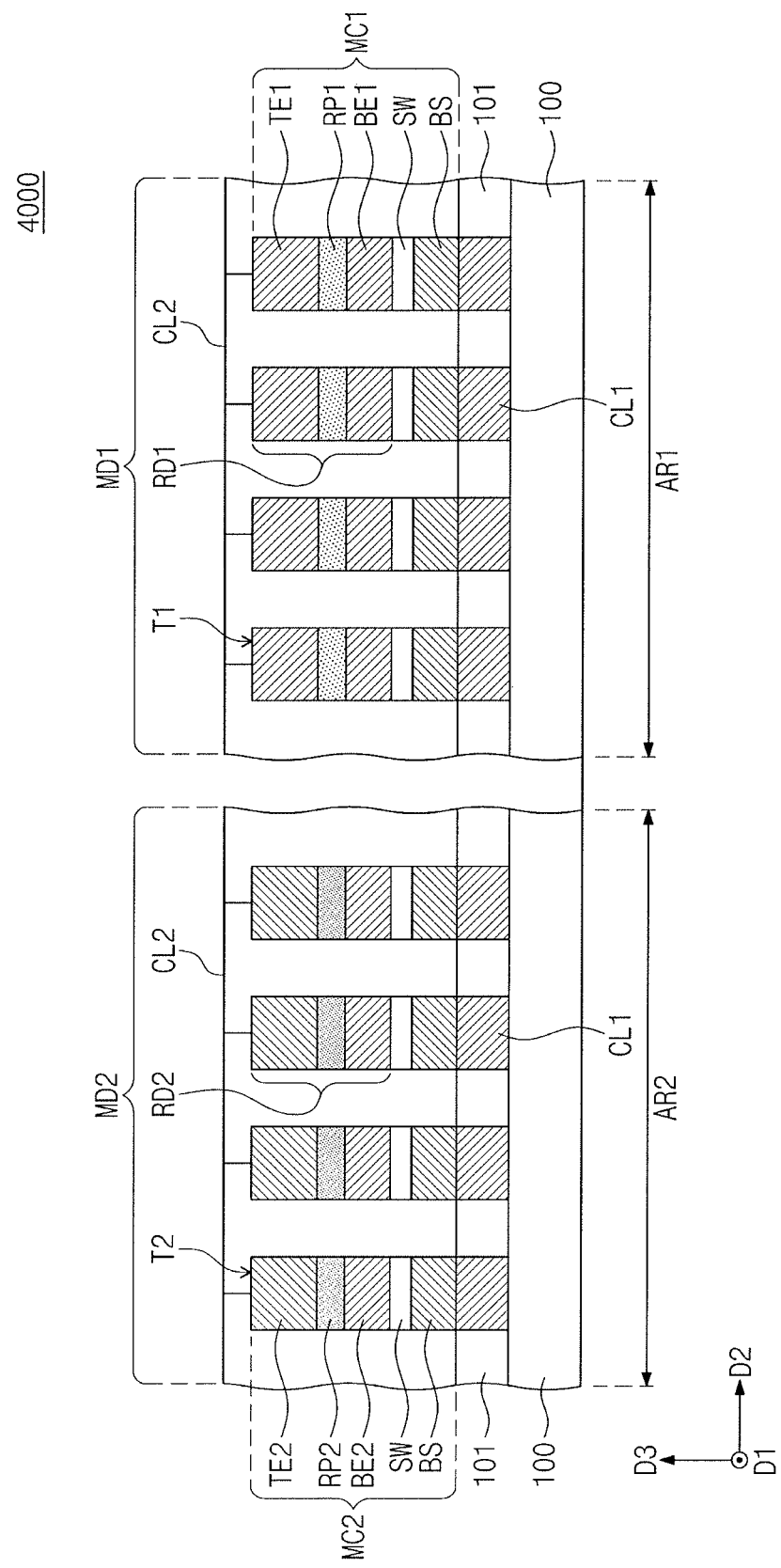
FIG. 6 illustrates a cross-sectional view of a variable resistance memory device according to some embodiments.

Referring again to FIG. 4, a cell patterning process may be performed on the first memory region AR1 and the second memory region AR2 at the same time. In addition, a conductive line CL electrically connected to the first memory cells MC1 may be formed, and a conductive line CL electrically connected to the second memory cells MC2 may be formed. For example, during the cell patterning process, the first bottom electrode material layer BEL1, the first variable resistance material layer RL1, and the first top electrode material layer TEL1 may be patterned to form the first bottom electrode BEL the first variable resistance pattern RP1, and the first top electrode TE1 of the first memory cells MC1, and the first bottom electrode material layer BEL1, the second variable resistance material layer RL2, and the second top electrode material layer TEL2 may be patterned to form the second bottom electrode BE2, the second variable resistance pattern RP2, and the second top electrode TE2 of the second memory cells MC2, FIG. 6 illustrates a cross-sectional view of a variable resistance memory device according to some embodiments. Hereinafter, repeated descriptions to the same components and features as mentioned with reference to FIG. 2 may be omitted for the purpose of ease and convenience in explanation.

Referring to FIG. 6, a variable resistance memory device 4000 according to the present embodiments may include a substrate 100, a first memory device MD1, and a second memory device MD2. The substrate 100 may include a first memory region AR1 and a second memory region AR2. An interlayer insulating layer 101 may be provided on the substrate 100. A plurality of first conductive lines CL1 may be provided in the interlayer insulating layer 101. The plurality of first conductive lines CL1 may be, e.g., word lines or bit lines. Each of the first conductive lines CL1 may extend in the first direction D1 parallel to a top surface of the substrate 100.

The first memory device MD1 may be on the first memory region AR1. The first memory device MD1 may include a plurality of first memory cells MC1. Each of the first memory cells MC1 may include a first resistance element RD1 and a selection element SW. In an implementation, each of the first memory cells MC1 may further include a sub-bottom electrode BS. The sub-bottom electrode BS, the selection element SW, and the first resistance element RD1 may be sequentially stacked in the third direction D3. The first resistance element RD1 may include a first bottom electrode BEL a first variable resistance pattern RP1, and a first top electrode TE1, which are sequentially stacked in the third direction D3.

The second memory device MD2 may include a plurality of second memory cells MC2. The second memory cells MC2 may be spaced apart from each other in the second direction D2. Each of the second memory cells MC2 may include a second resistance element RD2 and a selection element SW. In an implementation, each of the second memory cells MC2 may further include a sub-bottom electrode BS. The sub-bottom electrode BS, the selection element SW, and the second resistance element RD2 may be sequentially stacked in the third direction D3. The second resistance element RD2 may include a second bottom electrode BE2, a second variable resistance pattern RP2, and a second top electrode TE2, which are sequentially stacked in the third direction D3.

Second conductive lines CL2 may be on the first memory device MD1 and the second memory device MD2. The first conductive lines CL1, the first memory cells MC1, and the second conductive lines CL2 on the first memory region AR1 may constitute a cross point structure. The first conductive lines CL1, the second memory cells MC2, and the second conductive lines CL2 on the second memory region AR2 may constitute a cross point structure.

In relation of the first memory device MD1 and the second memory device MD2, the second variable resistance pattern RP2 may include a different material from that of the first variable resistance pattern RP1. When the same voltage is applied to the first and second variable resistance patterns RP1 and RP2, the amount of a current flowing through the second variable resistance pattern RP2 may be greater than the amount of a current flowing through the first variable resistance pattern RP1. For example, the first variable resistance pattern RP1 may have a resistance state that is greater than that of the second variable resistance pattern RP2. In an implementation, the maximum value of a variable resistance of the second resistance element RD2 may be less than the maximum value of a variable resistance of the first resistance element RD1.

A level of a top surface T1 of the first top electrode TE1 may be the same or substantially the same as a level of a top surface T2 of the second top electrode TE2.

FIGS. 7A to 7F illustrate cross-sectional views of stages in a method of manufacturing a variable resistance memory device according to some embodiments. Hereinafter, repeated descriptions to the same components and features as mentioned with reference to FIGS. 3A to 3I may be omitted for the purpose of ease and convenience in explanation.

Figure 7A:
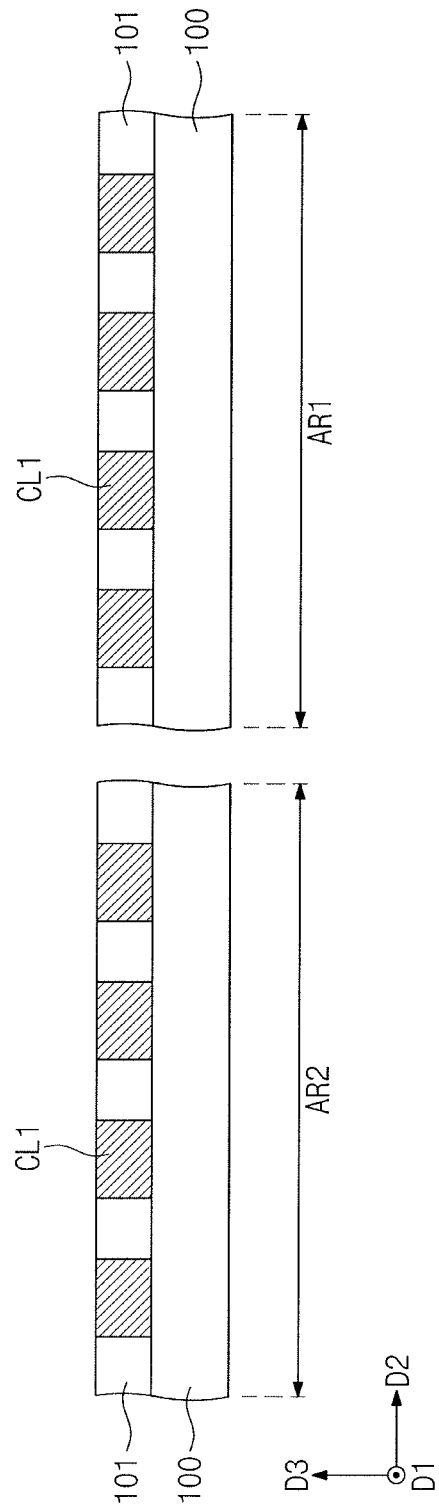

Referring to FIG. 7A, a substrate 100 including a first memory region AR1 and a second memory region AR2 may be provided. An interlayer insulating layer 101 may be provided on the substrate 100. A plurality of first conductive lines CL1 may be provided in the interlayer insulating layer 101. The plurality of first conductive lines CL1 may be, e.g., word lines or bit lines. Each of the first conductive lines CL1 may extend in the first direction D1 parallel to a top surface of the substrate 100.

Figure 7B:
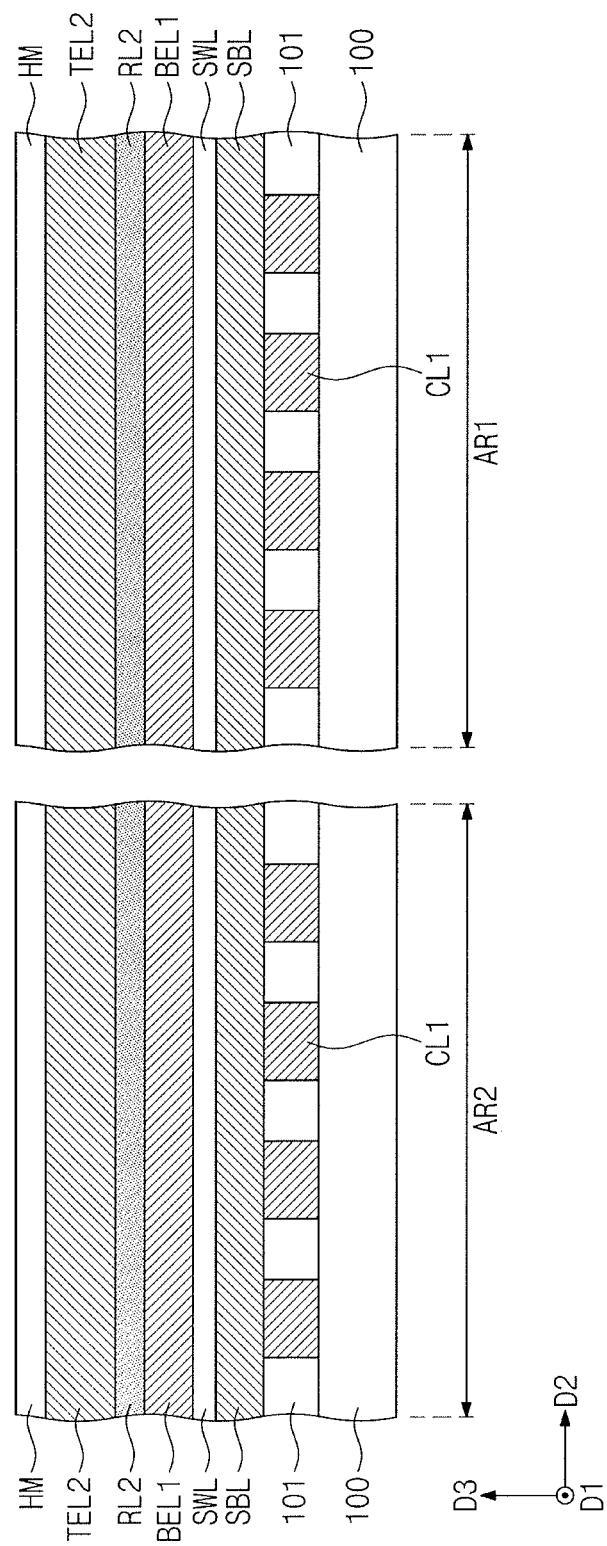

Referring to FIG. 7B, a sub-bottom electrode material layer SBL, a selection element material layer SWL, a first bottom electrode material layer BEL1, a second variable resistance material layer RL2, a second top electrode material layer TEL2, and a hard mask layer HM may be sequentially deposited on the first memory region AR1 and the second memory region AR2.

Figure 7C:
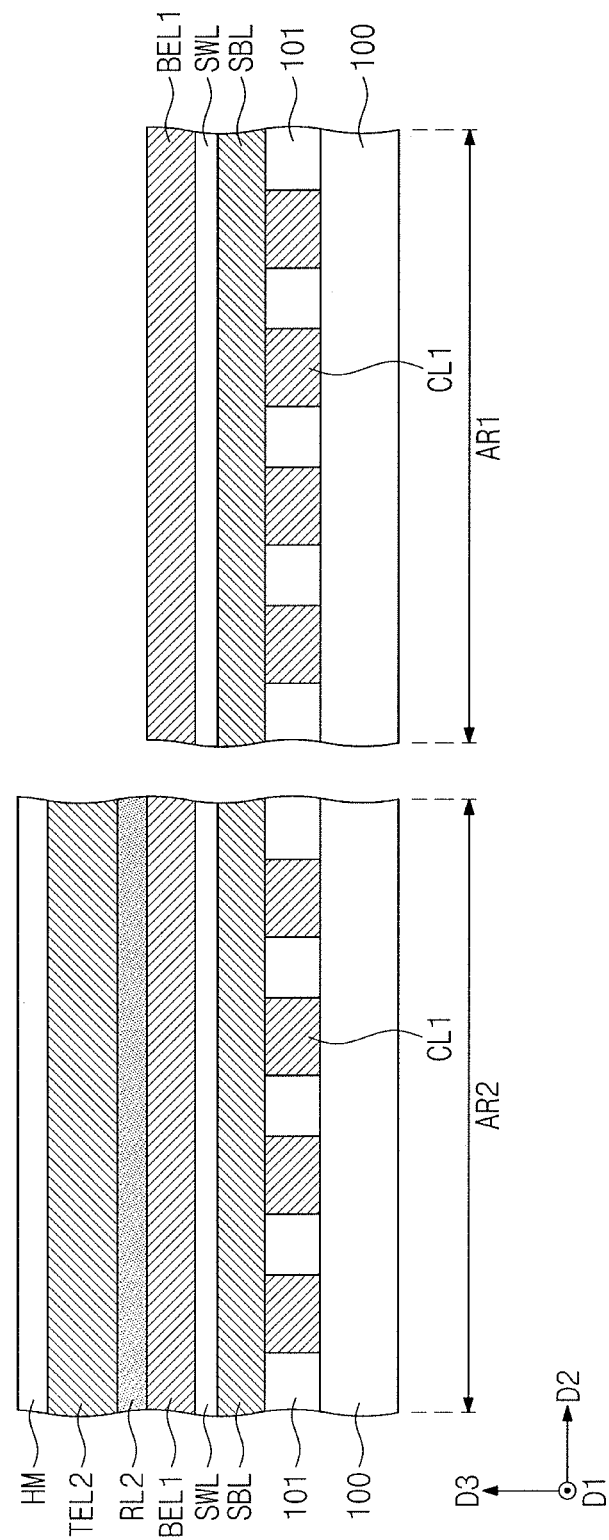

Referring to FIG. 7C, the hard mask layer HM, the second top electrode material layer TEL2, and the second variable resistance material layer RL2 on the first memory region AR1 may be removed.

Referring to FIG. 7D, a first variable resistance material layer RL1 and a first top electrode material layer TEL1 may be sequentially deposited on the first memory region AR1 and the second memory region AR2. Subsequently, an insulating layer DL may be formed on the first memory region AR1 and the second memory region AR2. The insulating layer DL may be thickly deposited in such a way that a height difference hardly occurs between a top surface of the insulating layer DL on the first memory region AR1 and a top surface of the insulating layer DL on the second memory region AR2.

Referring to FIG. 7E, a planarization process may be performed on the insulating layer DL on the first memory region AR1 and the second memory region AR2. When the first top electrode material layer TEL1 on the second memory region AR2 is exposed, a portion of the insulating layer DL may remain on the first memory region AR1.

Referring to FIG. 7F, the planarization process may further be performed on the first memory region AR1 and the second memory region AR2. For example, the planarization process may include a chemical mechanical polishing (CMP) process. A bottom surface of the hard mask layer HM on the second memory region AR2 may be used as a stop line of the planarization process.

The first top electrode material layer TEL1 on the first memory region AR1 and the second top electrode material layer TEL2 on the second memory region AR2 may be exposed to the outside by the planarization process. In addition, a level of a top surface of the first top electrode material layer TEL1 on the first memory region AR1 may be substantially the same as a level of a top surface of the second top electrode material layer TEL2 on the second memory region AR2.

Referring again to FIG. 6, a cell patterning process may be performed on the first memory region AR1 and the second memory region AR2 at the same time. For example, a second conductive line CL2 electrically connected to the first memory cells MC1 may be formed, and a second conductive line CL2 electrically connected to the second memory cells MC2 may be formed. For example, during the cell patterning process, the sub-bottom electrode material layer SBL, the selection element material layer SWL, the first bottom electrode material layer BEL1, the first variable resistance material layer RL1, and the first top electrode material layer TEL1 may be patterned to form the sub-bottom electrode BS, the selection element SW, the first bottom electrode BE1, the first variable resistance pattern RP1, and the first top electrode TE1 of the first memory cells MC1, and the sub-bottom electrode material layer SBL, the selection element material layer SWL, the first bottom electrode material layer BEL1, the second variable resistance material layer RL2, and the second top electrode material layer TEL2 may be patterned to form the sub-bottom electrode BS, the selection element SW, the second bottom electrode BE2, the second variable resistance pattern RP2, and the second top electrode TE2 of the second memory cells MC2

By way of summation and review, next-generation semiconductor memory devices (e.g., ferroelectric random access memory (FRAM) devices, magnetic random access memory (MRAM) devices, and phase-change random access memory (PRAM) devices) may provide high-performance and low power consuming semiconductor memory devices. Materials of these next-generation semiconductor memory devices may have resistance values variable according to currents or voltages applied thereto and may retain their resistance values even when currents or voltages are interrupted.

According to the embodiments, the first memory cell having high storage ability and the second memory cell having a high processing speed may be formed on a single chip, and efficiency of the chip may be improved or maximized. In addition, a height difference between the first and second memory cells may hardly exist, and a margin in a subsequent photolithography process may be secured.

Performance of an entire chip may be improved using the variable resistance memory device according to the embodiments.

One or more embodiments may provide a variable resistance memory device capable of improving or maximizing efficiency of a semiconductor chip.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a variable resistance memory device, the method comprising:

forming a bottom electrode material layer on a substrate that includes a first memory region and a second memory region;
forming a first variable resistance material layer on the bottom electrode material layer;
forming a first top electrode material layer on the first variable resistance material layer;
removing the first variable resistance material layer and the first top electrode material layer on the second memory region;
forming a second variable resistance material layer on the substrate;
forming a second top electrode material layer on the second variable resistance material layer;
removing the second variable resistance material layer and the second top electrode material layer on the first memory region; and
patterning the bottom electrode material layer, the first variable resistance material layer, the second variable resistance material layer and the first and second top electrode material layers, which remain on the substrate, to form first memory cells on the first memory region and second memory cells on the second memory region,
wherein:
the removing the second variable resistance material layer and the second top electrode material layer on the first memory region includes performing a planarization process to expose the first top electrode material layer on the first memory region,
the first variable resistance material layer includes a material of which a maximum resistance value is different from that of a material of the second variable resistance material layer,
the first memory cells each include a first bottom electrode and the second memory cells each include a second bottom electrode, a level of a bottom surface of the first bottom electrode being higher than a level of a bottom surface of the second bottom electrode, and
a thickness of the first bottom electrode is thinner than a thickness of the second bottom electrode.

2. The method as claimed in claim 1, wherein the planarization process is performed until a level of a top surface of the first top electrode material layer on the first memory region is substantially the same as a level of a top surface of the second top electrode material layer on the second memory region.

3. The method as claimed in claim 1, wherein each of the first memory cells and the second memory cells is electrically connected to a transistor in the substrate.

4. The method as claimed in claim 1, further comprising forming a selection element material layer on the substrate such that the selection element material layer is between the bottom electrode material layer and the substrate.

5. The method as claimed in claim 1, wherein forming the first variable resistance material layer and forming the second variable resistance material layer independently include performing an atomic layer deposition (ALD) process, a physical vapor deposition (PVD) process, or a co-sputtering process.

6. The method as claimed in claim 1, further comprising forming a selection element material layer on one of the first memory region and the second memory region such that wherein the selection element material layer is between the bottom electrode material layer and the substrate.

7. The method as claimed in claim 1, wherein each of the first variable resistance material layer and the second variable resistance material layer includes an oxide including an element selected from the group consisting of Ti, Zr, Al, Hf, and Si.

8. The method as claimed in claim 1, further comprising:
forming a first conductive line electrically connected to each of the first memory cells, the first conductive line being on the first memory region and between each of the first memory cells and the substrate; and
forming a second conductive line electrically connected to the first memory cells, the second conductive line being on the first memory cells,
wherein:
the second memory region includes a transistor electrically connected to each of the second memory cells,
the first conductive line extends in a first direction parallel to a top surface of the substrate, and
the second conductive line extends in a second direction parallel to the top surface of the substrate and perpendicular to the first direction.

9. The method as claimed in claim 1, wherein the planarization process includes a chemical mechanical polishing (CMP) process.

10. The method as claimed in claim 1, further comprising forming a sub-bottom electrode material layer on the substrate.

* * * * *